(12) United States Patent
Baek

(10) Patent No.: US 11,678,488 B2
(45) Date of Patent: Jun. 13, 2023

(54) THREE-DIMENSIONAL SEMICONDUCTOR MEMORY DEVICE

(71) Applicant: SAMSUNG ELECTRONICS CO., LTD., Suwon-si (KR)

(72) Inventor: Seokcheon Baek, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 37 days.

(21) Appl. No.: 17/515,981

(22) Filed: Nov. 1, 2021

(65) Prior Publication Data
US 2022/0059565 A1 Feb. 24, 2022

Related U.S. Application Data

(63) Continuation of application No. 16/733,849, filed on Jan. 3, 2020, now Pat. No. 11,164,886.

(30) Foreign Application Priority Data

May 15, 2019 (KR) ......................... 10-2019-0057105

(51) Int. Cl.
*H01L 23/528* (2006.01)
*H01L 27/11582* (2017.01)
*H01L 27/11524* (2017.01)
*H01L 27/11556* (2017.01)
*H01L 27/11529* (2017.01)
*H01L 27/1157* (2017.01)
(Continued)

(52) U.S. Cl.
CPC .. *H01L 27/11582* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/5283* (2013.01); *H01L 23/535* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
None
See application file for complete search history.

(56) References Cited

U.S. PATENT DOCUMENTS

| 8,445,347 B2 | 5/2013 | Alsmeier |
| 8,765,598 B2 | 7/2014 | Smith et al. |
(Continued)

FOREIGN PATENT DOCUMENTS

KR 10-2017-0046892 5/2017

*Primary Examiner* — Hsien Ming Lee
(74) *Attorney, Agent, or Firm* — F. Chau & Associates, LLC

(57) ABSTRACT

A three-dimensional semiconductor memory device including: a substrate including a cell array region and a connection region; and an electrode structure extending along a first direction from the cell array region to the connection region and is a plurality of electrodes vertically stacked OD the substrate, each of the electrodes including an electrode portion on the cell array region and a pad portion on the connection region, wherein the electrodes include a first electrode located at a first level from the substrate and a second electrode located at a second level from the substrate, the second level being higher than the first level, and the pad portion of the first electrode is closer to the cell array region than the pad portion of the second electrode.

20 Claims, 40 Drawing Sheets

(51) Int. Cl.
*H01L 27/11573* (2017.01)
*H01L 21/768* (2006.01)
*H01L 23/535* (2006.01)
*H01L 23/522* (2006.01)

(56) References Cited

U.S. PATENT DOCUMENTS

| | | |
|---|---|---|
| 8,937,346 B2 | 1/2015 | Aritome |
| 9,184,178 B2 | 11/2015 | Jang et al. |
| 9,196,364 B2 | 11/2015 | Kim et al. |
| 9,768,233 B1 | 9/2017 | Fukuda et al. |
| 9,865,540 B2 | 1/2018 | Kim et al. |
| 9,871,053 B2 | 1/2018 | Kwak |
| 9,917,096 B2 | 3/2018 | Kamigaichi |
| 10,700,441 B2 | 6/2020 | Watson |
| 10,777,565 B2 | 9/2020 | Jung et al. |
| 2010/0090286 A1 | 4/2010 | Lee et al. |
| 2012/0280303 A1 | 11/2012 | Kiyotoshi et al. |
| 2018/0374862 A1 | 12/2018 | Lee et al. |
| 2019/0244970 A1* | 8/2019 | Jung ................ H01L 27/11582 |
| 2020/0365616 A1 | 11/2020 | Baek |

* cited by examiner

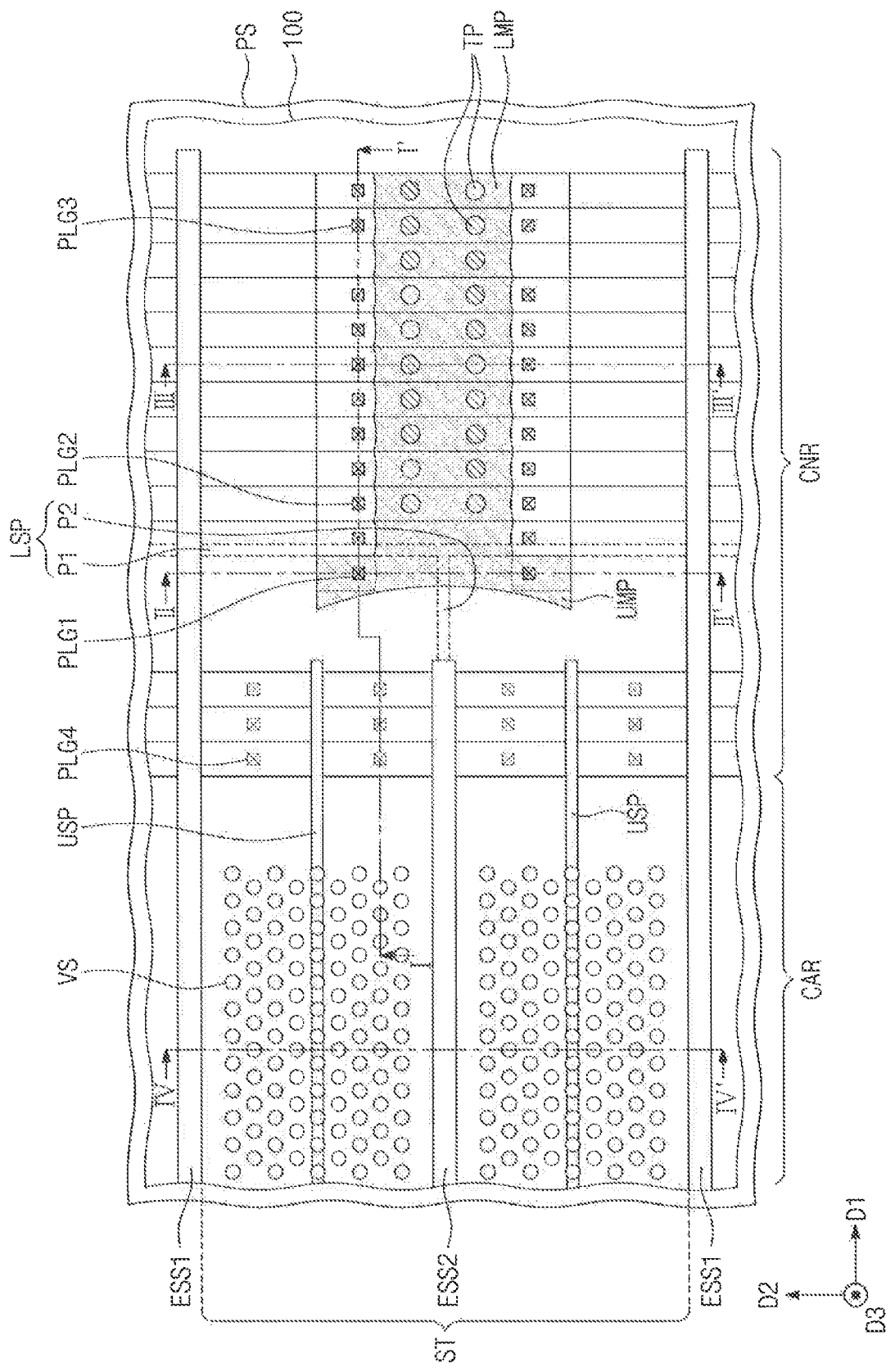

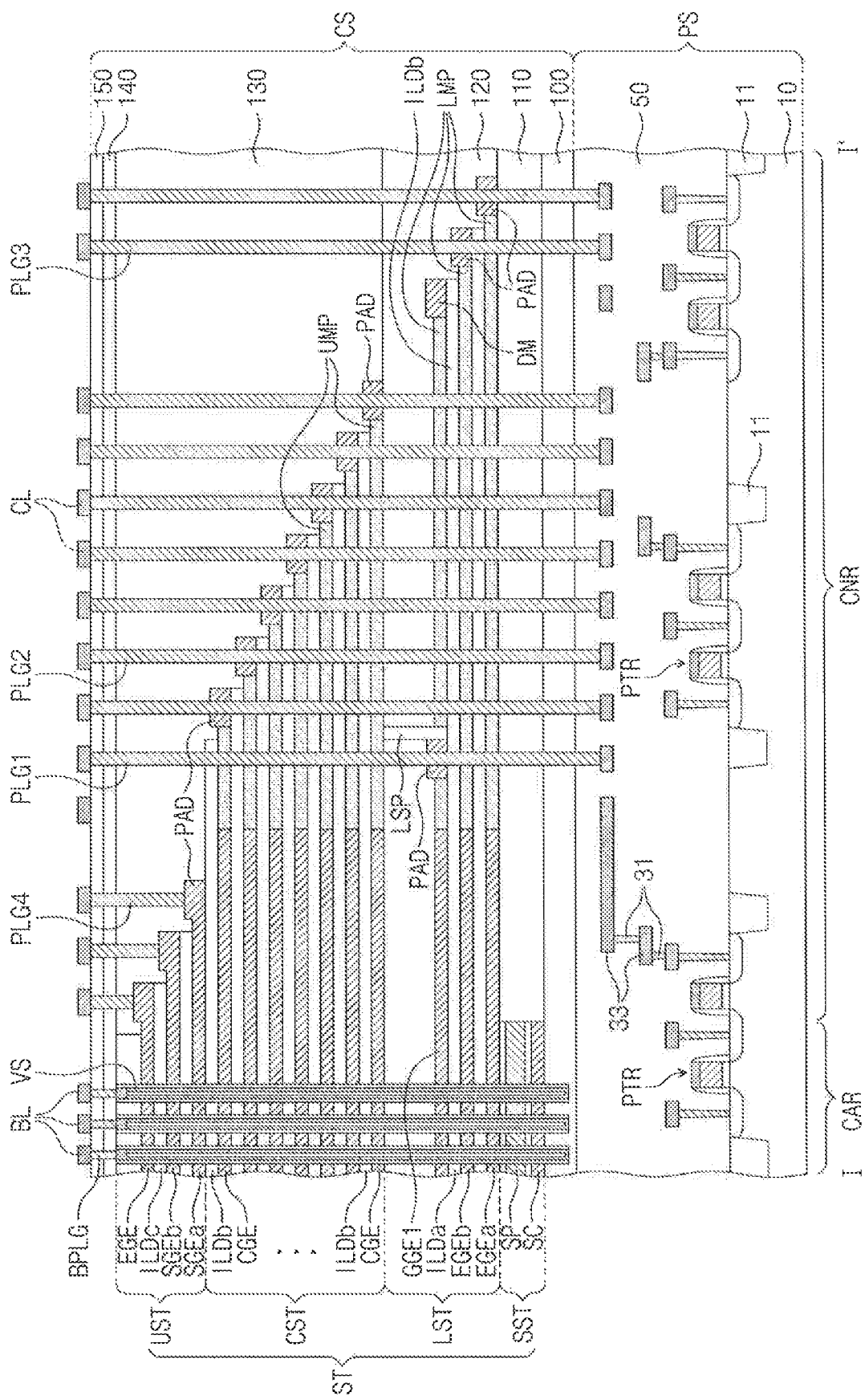

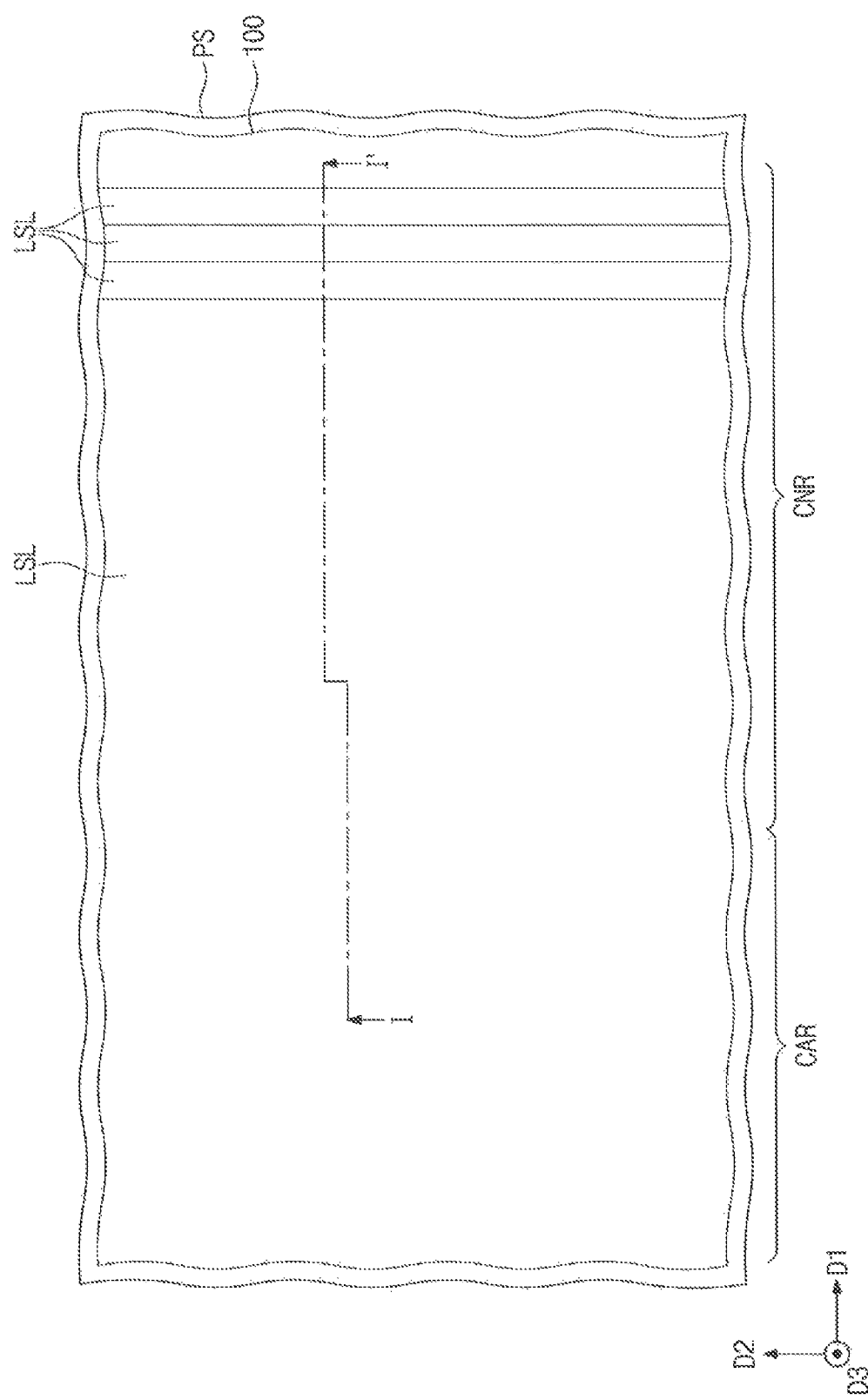

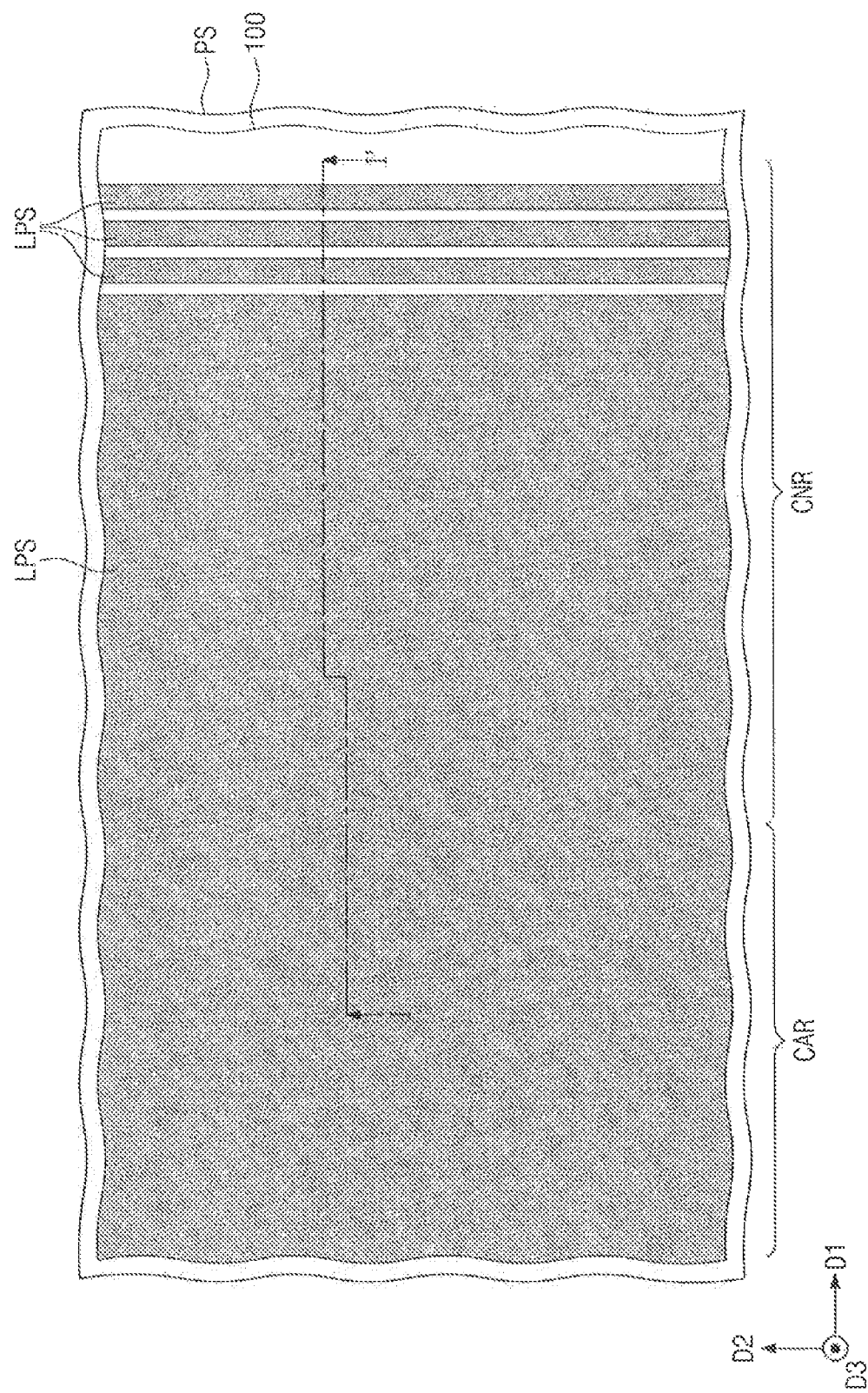

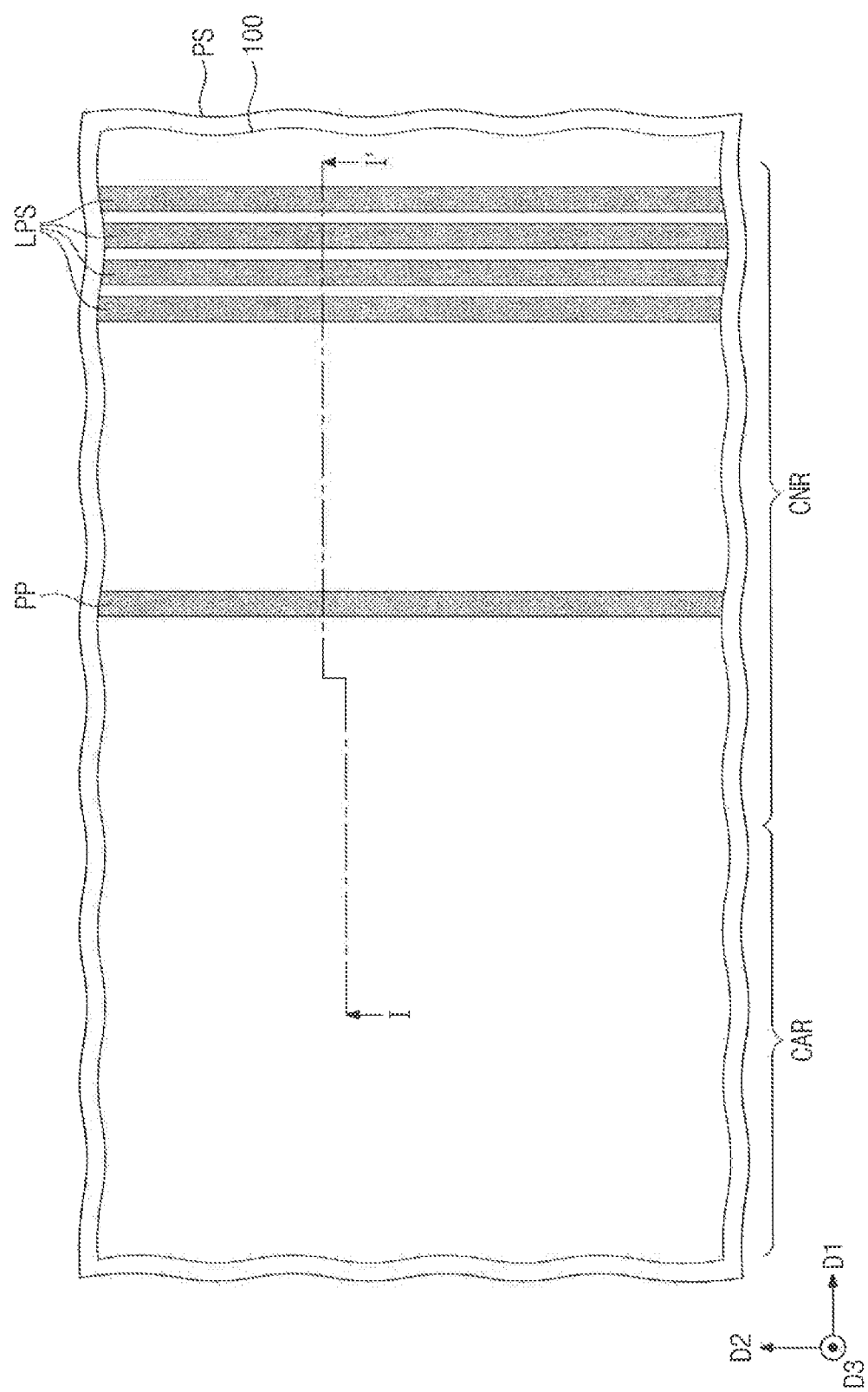

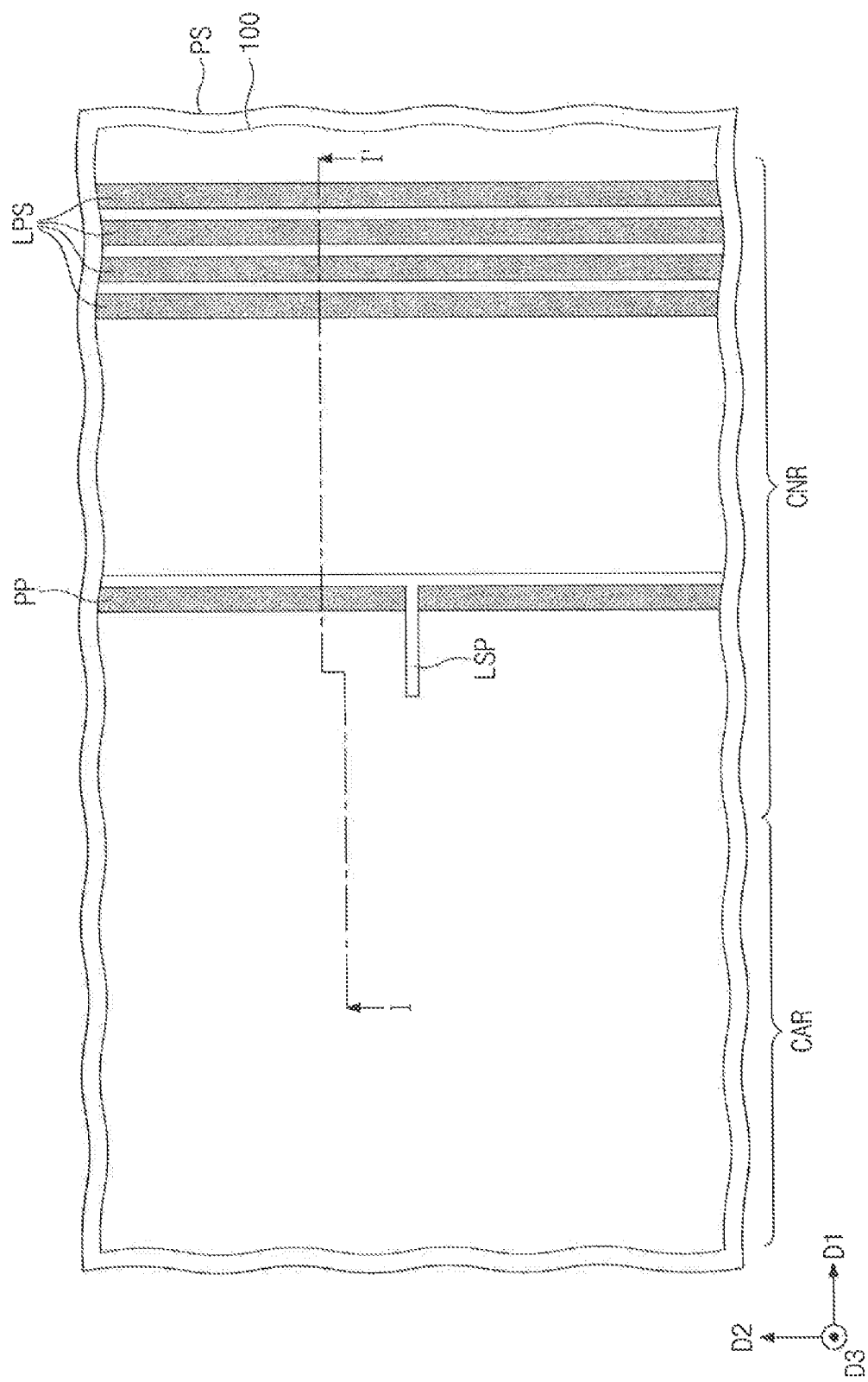

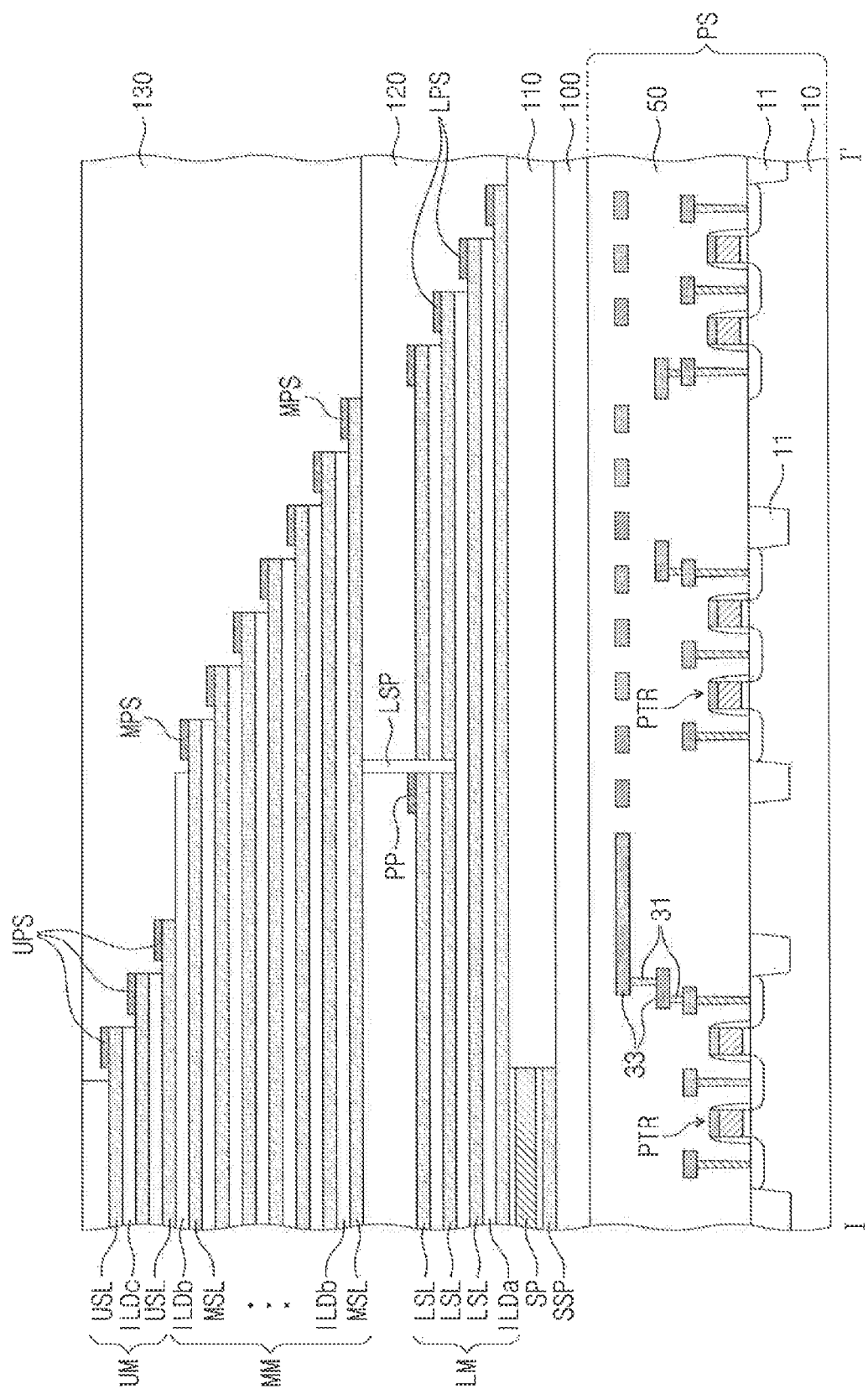

THREE-DIMENSIONAL SEMICONDUCTOR MEMORY DEVICE

CROSS-REFERENCE TO RELATED APPLICATIONS

This U.S. non-provisional application is a continuation of U.S. patent application Ser. No. 16/733,849 filed on Jan. 3, 2020, which claims priority under 35 U.S.C. § 119 to Korean Patent Application No. 10-2019-0057105 filed on May 15, 2019 in the Korean Intellectual Property Office, the disclosures of which are incorporated by reference herein in their entireties.

TECHNICAL FIELD

The present inventive concept relates to three-dimensional semiconductor memory devices, and more particularly, to three-dimensional semiconductor memory devices with increased integration.

DISCUSSION OF RELATED ART

Highly integrated semiconductor devices with high performance and low cost are in constant demand. Therefore, three-dimensional semiconductor memory devices including three-dimensionally arranged memory cells have been developed.

SUMMARY

According to an exemplary embodiment of the present inventive concept, a three-dimensional semiconductor memory device may include a substrate including a cell array region and a connection region; and an electrode structure extending along a first direction from the cell array region to the connection region and including a plurality of electrodes vertically stacked on the substrate, each of the electrodes including an electrode portion on the cell array region and a pad portion on the connection region, wherein the electrodes include a first electrode located at a first level from the substrate and a second electrode located at a second level from the substrate, the second level being higher than the first level, and the pad portion of the first electrode is closer to the cell array region than the pad portion of the second electrode.

According to an exemplary embodiment of the present inventive concept, a three-dimensional semiconductor memory device may include a substrate including a cell array region and a connection region; and an electrode structure extending along a first direction from the cell array region to the connection region, the electrode structure including a plurality of electrodes vertically stacked on the substrate and a plurality of mold patterns, wherein each of the mold patterns is located at the same level as a corresponding one of the electrodes, wherein the electrodes include: a plurality of first electrodes located at a first level from the substrate, the first electrodes spaced apart from each other in a second direction intersecting the first direction; and a plurality of second electrodes vertically stacked on the first electrodes, wherein each of the first and second electrodes includes an electrode portion on the cell array region and a pad portion on the connection region, the pad portions of the first electrodes are closer to the cell array region than the pad portions of the second electrodes, and the pad portions of the first and second electrodes overlap the mold patterns.

According to an exemplary embodiment of the present inventive concept, a three-dimensional semiconductor memory device may include a substrate including a cell array region and a connection region; and an electrode structure extending alone a first direction from the cell array region to the connection region and including a plurality of electrodes vertically stacked on the substrate, each of the electrodes including an electrode portion on the cell array region and a pad portion on the connection region, wherein the electrodes include: a plurality of ground select gate electrodes located at a first level from the substrate, the ground select gate electrodes being spaced apart from each other in a second direction intersecting the first direction; first and second string select gate electrodes separated from each other in the second direction on each of the ground select gate electrodes; and a plurality of cell gate electrodes vertically stacked between the ground select gate electrodes and the first and second string select gate electrodes, wherein the pad portions of the ground select gate electrodes are between the pad portions of the first and second string select gate electrodes and the pad portions of the cell gate electrodes.

According to an exemplary embodiment of the present inventive concept, a three-dimensional semiconductor memory device may include a substrate including a first connection region, a second connection region, and a cell array region between the first and second connection regions; an electrode structure extending along a first direction from the cell array region to the first and second connection regions and including a plurality of electrodes vertically stacked on the substrate; a plurality of first mold patterns on the first connection region, each of the first mold patterns located at the same level as a corresponding one of the electrodes; and a plurality of second mold patterns on the second connection region, each of the second mold patterns located at the same level as a corresponding one of the electrodes, wherein each of the electrodes includes an electrode portion on the cell array region, a first pad portion on the first connection region, and a second pad portion on the second connection region, the first pad portions of the electrodes overlap the first mold patterns, and the second pad portions of the electrodes overlap the second mold patterns.

According to an exemplary embodiment of the present inventive concept, a three-dimensional semiconductor memory device may include a stack structure extending in a first direction and including a plurality of horizontal patterns vertically stacked on a substrate; a vertical structure vertically penetrating the stack structure; and a plurality of conductive lines extending in a second direction on the stack structure, the second direction intersecting the first direction, wherein one or more of the horizontal patterns, the vertical structure, and the conductive lines include a line portion and a pad portion that horizontally protrudes from the line portion, and a thickness of the pad portion is greater than a thickness of the line portion.

According to an exemplary embodiment of the present inventive concept, a three-dimensional semiconductor memory device may include: a peripheral logic structure; a cell array structure disposed on the peripheral logic structure, the cell array structure including: a cell array region and a connection region; a plurality of cell gate electrodes disposed on the cell array region and having pads disposed in the connection region, the pads of the cell gate electrodes having a stepwise shape; and a ground select gate electrode disposed between the cell gate electrodes and the peripheral logic structure, the ground select gate electrode including a pad that is closer to the cell array region than the pads of the cell gate electrodes.

BRIEF DESCRIPTION OF THE DRAWINGS

FIG. 5 is a plan view of a three-dimensional semiconductor memory device according to exemplary embodiments of the present inventive concept.

FIGS. 6A, 6B, 6C and 6D are cross-sectional views respectively taken along lines I-I', II-II', and III-III', and IV-IV' of FIG. 5, showing a three-dimensional semiconductor memory device according to exemplary embodiments of the present inventive concept.

FIGS. 15A, 15B, 16A, 16B, 17A, 17B, 18A, 18B, 19A, 19B, 20A, 20B, 20C and 21A are plan views showing a method of fabricating a three-dimensional semiconductor memory device according to exemplary embodiments of the present inventive concept.

FIGS. 15B, 16B, 17B, 18B, 19B, 20B, 21B, 22A, and 23A are cross-sectional views taken along line I-I' of FIGS. 15A, 16A, 17A, 18A, 19A, 20A and 21A, showing a method of fabricating a three-dimensional semiconductor memory device according to exemplary embodiments of the present inventive concept.

FIGS. 20C, 21C, 22B, and 23B are cross-sectional views taken along line II-II' of FIGS. 20A and 21A.

DETAILED DESCRIPTION OF THE EMBODIMENTS

The following will now describe three-dimensional semiconductor memory devices and methods of fabricating the same according to exemplary embodiments of the present inventive concept in conjunction with the accompanying drawings.

Figure 1:
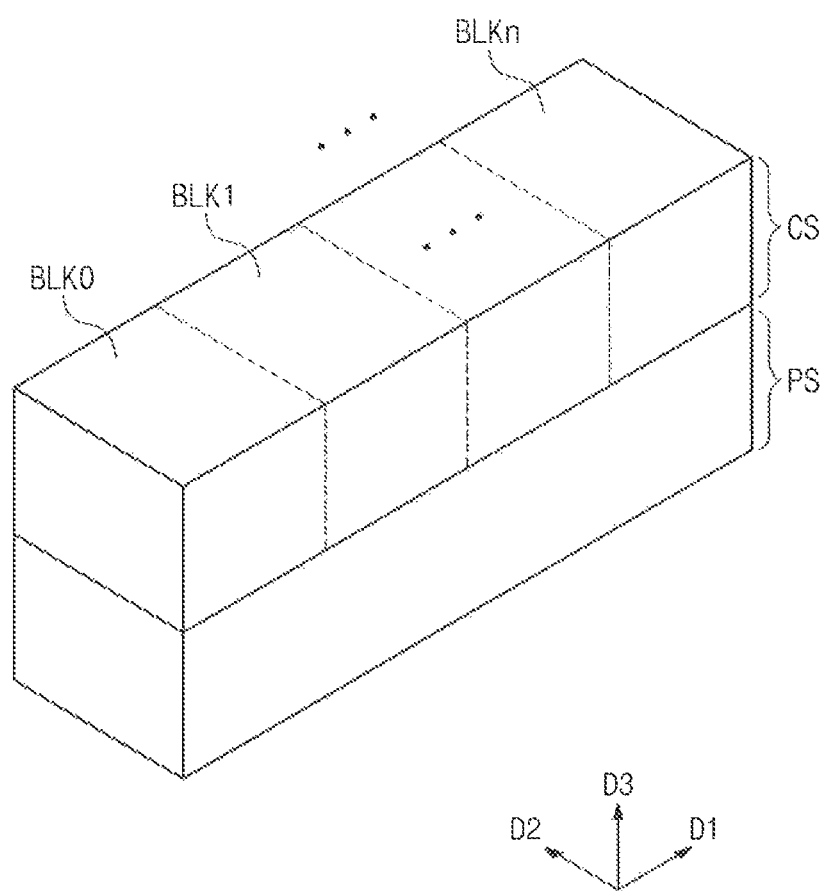
FIG. 1 is a perspective view of a three-dimensional semiconductor memory device according to exemplary embodiments of the present inventive concept.

FIG. 1 is a perspective view showing a three-dimensional semiconductor memory device according to exemplary embodiments of the present inventive concept.

Referring to FIG. 1, a three-dimensional semiconductor memory device according to exemplary embodiments of the present inventive concept may include a peripheral logic structure PS, a cell array structure CS on the peripheral logic structure PS, and a connection line structure that connects the cell array structure CS to the peripheral logic structure PS.

The peripheral logic structure PS may include row and column decoders, a page buffer, and control circuits.

When viewed in a plan view, the cell array structure CS may overlap the peripheral logic structure PS. The cell array structure CS may include a plurality of memory blocks BLK0 to BLKn each of which is a data erasure unit. Each of the memory blocks BLK0 to BLKn may include a memory cell array having a three-dimensional structure (or a vertical structure).

Figure 2:
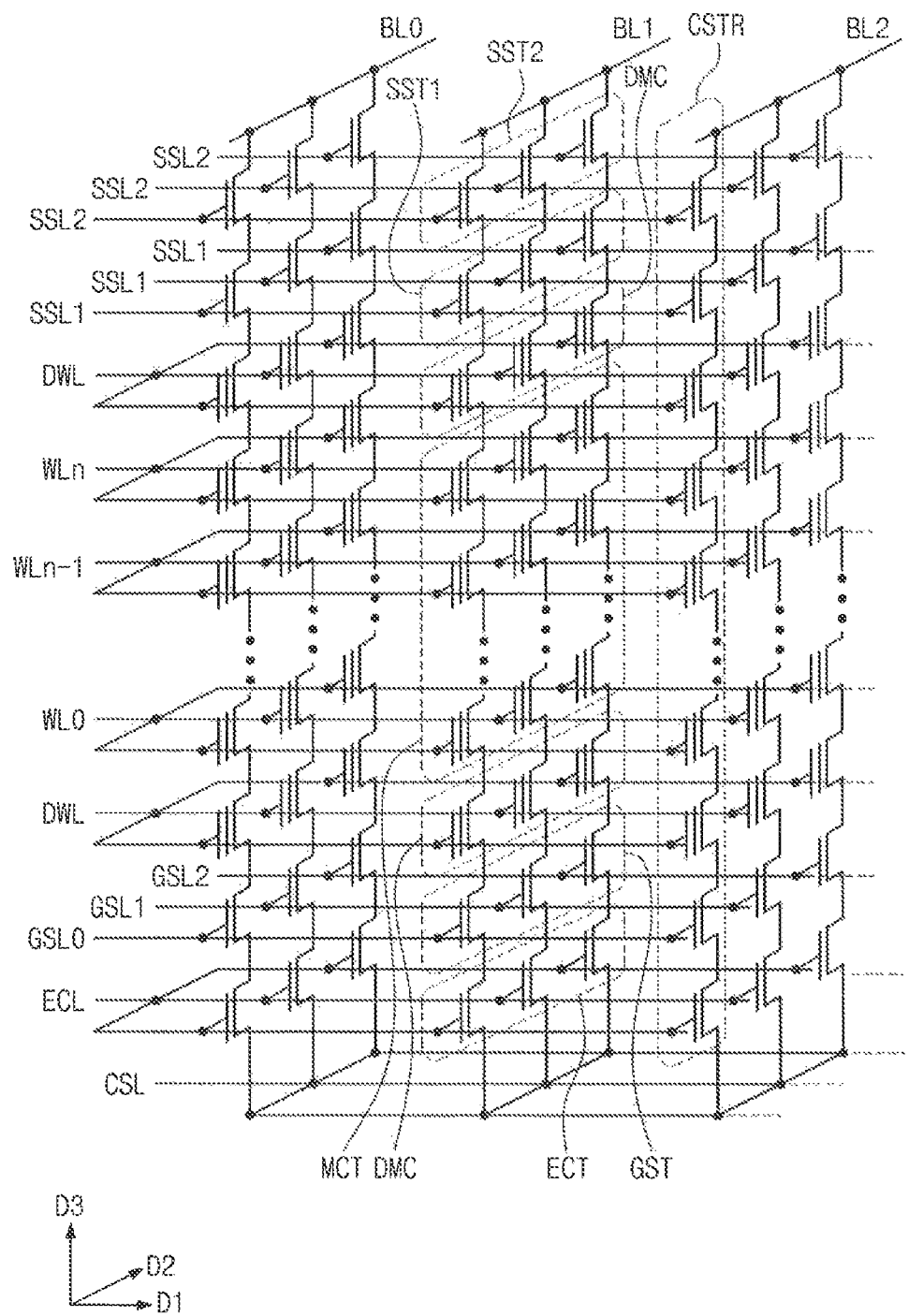
FIG. 2 is a circuit diagram of a cell array of a three-dimensional semiconductor memory device according to exemplary embodiments of the present inventive concept.

FIG. 2 is a circuit diagram showing a cell array of a three-dimensional semiconductor memory device according to exemplary embodiments of the present inventive concept.

Referring to FIG. 2, cell strings CSTR may be two-dimensionally arranged along first and second directions D1 and D2, and may extend along a third direction D3. A plurality of cell strings CSTR may be connected in parallel to each of bit lines BL0, BL1 and BL2. The plurality of cell strings CSTR may be connected in common to a common source line CSL.

Each of the cell strings CSTR may include first and second string select transistors SST1 and SST2 connected in series, memory cell transistors MCT connected in series, a ground select transistor GST, and an erase control transistor ECT. Each of the memory cell transistors MCT may include a data storage element. Each of the cell strings CSTR may further include dummy cell transistors DMC, wherein a first dummy cell transistor is connected between the first string select transistor SST1 and an uppermost one of the memory cell transistors MCT and a second dummy cell transistor is connected between the ground and select transistor GST and a lowermost one of the memory cell transistors MCT.

The first string select transistor SST1 may be controlled by a first string select line SSL1, and the second string select transistor SST2 may be controlled by a second string select line SSL2. The memory cell transistors MCT may be controlled by a plurality of word lines WL0 to WLn, and the dummy cell transistors DMC may be controlled by dummy word lines DWL. The ground select transistor GSI may be controlled by a ground select line GSL0, GSL1, or GSL2, and the erase control transistor ECT may be controlled by an erase control line ECL.

Figure 3:
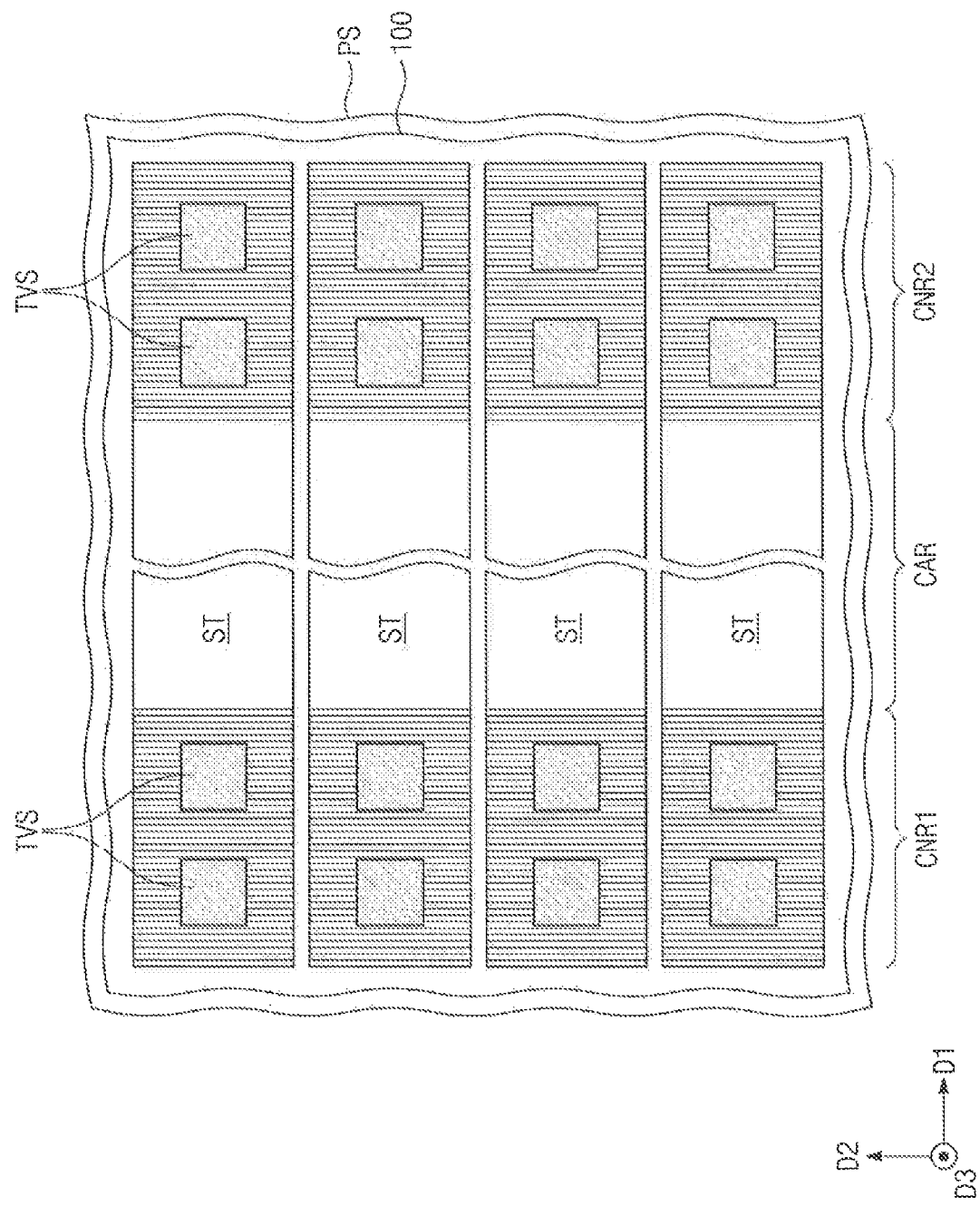
FIG. 3 is a plan view of a cell array structure of a three-dimensional semiconductor memory device according to exemplary embodiments of the present inventive concept.

FIG. 3 is a plan view showing a three-dimensional semiconductor memory device according to exemplary embodiments of the present inventive concept.

Referring to FIG. 3, a three-dimensional semiconductor memory device according to exemplary embodiments of the present inventive concept may include a peripheral logic. structure PS and a cell array structure (see CS of FIG. 1) on the peripheral logic structure PS.

The cell array structure (see CS of FIG. 1) may include a plurality of memory blocks (see BLK0 to BLKn of FIG. 1) on a horizontal layer 100. As discussed with referee ce to FIG. 2, each of the memory blocks BLK0 to BLKn may include a memory cell array having a three-dimensional structure (or a vertical structure).

The horizontal layer 100 may include a cell array region CAR, a first connection region CNR1 on one side of the cell array region CAR, and a second connection region CNR2 on the other side of the cell array region CAR. In other words, the first and second connection regions CNR1 and CNR2 may be disposed on opposite sides of the cell array region CAR. The first and second connection regions CNR1 and CNR2 may be spaced apart in a first direction D1 from each other across the cell array region CAR.

Each of the memory blocks (see BLK0 to BLKn of FIG. 1) may include an electrode structure ST including a plurality of electrodes that are vertically stacked on the horizontal layer 100, and may also include one or more through line structures TVS that connect the electrode structure ST to the peripheral logic structure PS.

The electrode structures ST may extend along the first direction D1 from the first connection region CNR1 to the second connection region CNR2. For example, the electrode structures ST may overlap the cell array region CAR, the first connection region CNR1 and the second connection region CNR2. The electrode structures ST may be spaced apart from each other in a second direction D2 intersecting the first direction D1. The first and second directions D1 and D2 may be parallel to a top surface of the horizontal layer 100. In each electrode structure ST, the electrodes may extend in the first direction D1 and may be stacked to have a stepwise shape on each of the first and second connection regions CNR1 and CNR2.

On each of the first and second connection regions CNR1 and CNR2, the through line structure TVS may vertically penetrate the electrode structure ST and the horizontal layer 100. The through line structure TVS may include a plurality of through plugs that electrically connect the cell array structure (see CS of FIG. 1.) to the peripheral logic structure PS, and may also include a plurality of connection lines coupled to the through plugs.

In exemplary embodiments of the present inventive concept, the through line structure TVS may penetrate a portion of the electrode structure ST, and may be provided on the same area as that on which pads of the electrodes are provided. On each of the first and second connection regions CNR1 and CNR2, contact plugs may be coupled to the electrodes and may be electrically connected to the through plugs. This will be further discussed below in detail.

Figure 4:
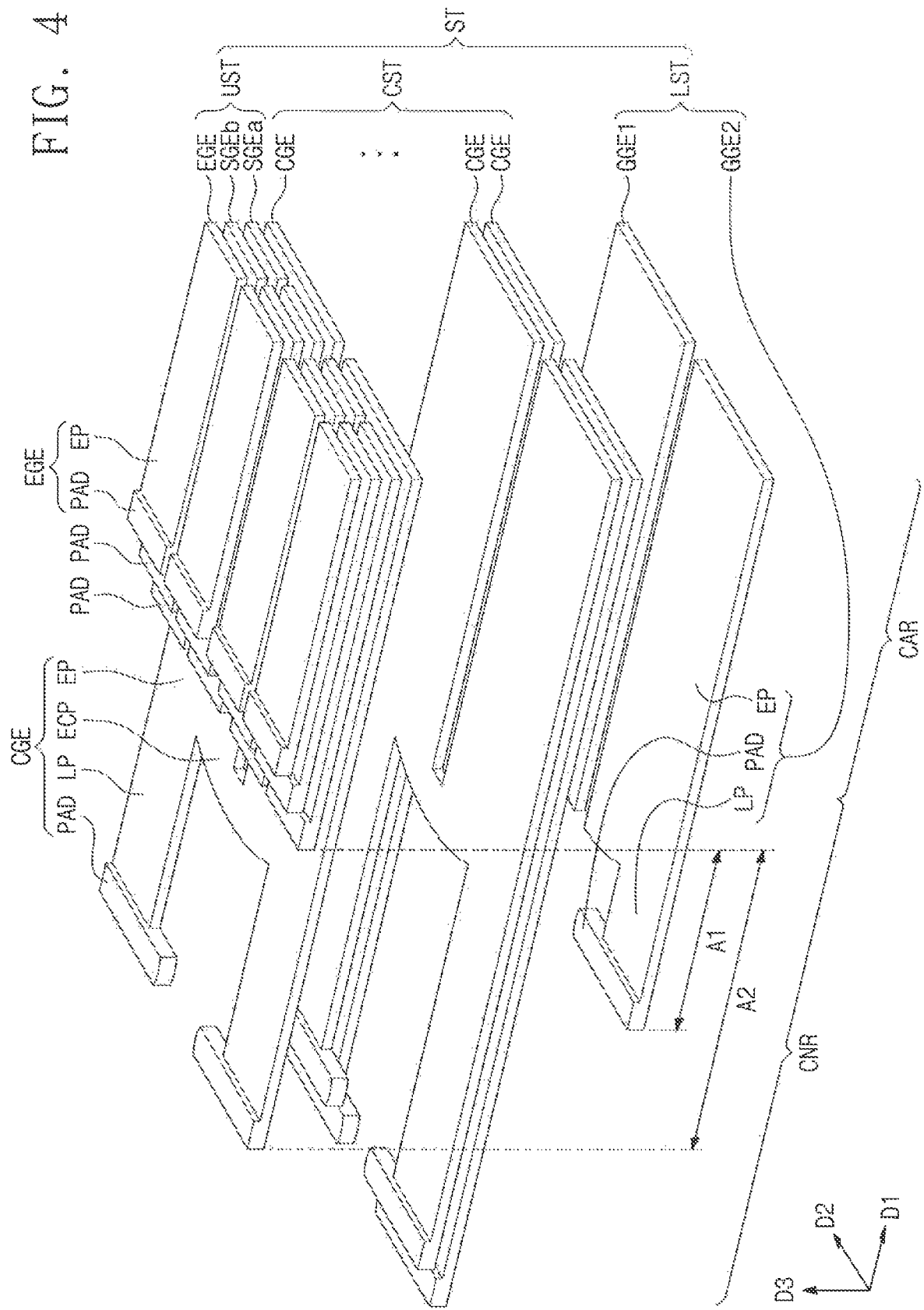
FIG. 4 is a perspective view of an electrode structure of a three-dimensional semiconductor memory device according to exemplary embodiments of the present inventive concept.

FIG. 4 is a perspective view showing an electrode structure of a three-dimensional semiconductor memory device according to exemplary embodiments of the present inventive concept.

Referring to FIG. 4, an electrode structure ST may include a lower electrode structure LST, a cell electrode structure CST on the lower electrode structure LST, and an upper electrode structure UST on the cell electrode structure CST.

The lower electrode structure LST may extend in a first direction D1, and may include first and second ground select gate electrodes GGE1 and GGE2 spaced apart from each other in a second direction D2 intersecting the first direction D1.

Each of the first and second ground select gate electrodes GGE1 and GGE2 may include an electrode portion EP that extends in the first direction D1 on a cell array region CAR, a line portion LP that extends in the first direction D1 on a connection region CNR and has a width less than that of the electrode portion EP, and a pad portion PAD that protrudes in the second direction D2 from the line portion LP. In each of the first and second ground select gate electrodes GGE1 and GGE2, the pad portion PAD may be thicker than the line portion LP. For example, in each of the first and second ground select gate electrodes GGE1 and GGE2, the pad portion PAD may have a top surface at a higher level than a top surface of the line portion LP.

The cell electrode structure CST may include cell gate electrodes CGE that are stacked in a third direction D3 on the lower electrode structure LST. The cell gate electrodes CGE have lengths in the first direction D1 that decrease as the distance from the lower electrode structure LST increases.

Each of the cell gate electrodes CGE may include electrode portions EP that extend in the first direction D1 on the cell array region CAR, a connection portion ECP that horizontally connects the electrode portions EP to each other, line portions LP that extend in the first direction D1 from the connection portions ECP and have widths less than widths of the electrode portions EP, and pad portions PAD that protrude in the second direction D2 from the line portions LP. The pad portions PAD of the cell gate electrodes CGE may be located at positions horizontally and vertically different from each other. In each of the cell gate electrodes CGE, the pad portion PAD may have a thickness greater than that of the line portion LP.

The upper electrode structure UST may include lower and upper string select gate electrodes SGEa and SGEb, and erase gate electrodes EGE. The lower and upper string select gate electrodes SGEa, SGEb, and the erase gate electrodes EGE are stacked in a third direction D3 on the cell electrode structure CST.

The lower and upper string select gate electrodes SGEa and SGEb may have a uniform width and extend in the first direction D1, and the width of each of the lower and upper string select gate electrodes SGEa and SGEb may be less than that of the electrode portion EP of the cell gate electrode CGE.

Each of the lower and upper string select gate electrodes SGEa and SGEb may include at electrode portion EP on the connection region CNR and a pad portion PAD on the cell array region CAR, and the pad portions PAD may be located at positions horizontally and vertically different from each other. In each of the lower and upper string select gate electrodes SGEa and SGEb, the pad portion PAD may have a thickness greater than that of the electrode portion EP. The erase gate electrodes EGE may have substantially same structure as that of the lower and upper string select gate electrodes SGEa and SGEb.

A pair of lower and upper string select gate electrodes SGEa and SGEb may be disposed on a corresponding one of the first and second ground select gate electrodes GGE1 and GGE2. For example, when viewed in a plan view, a pair of lower and upper string select gate electrodes SGEa and SGEb may overlap either the first ground select gate electrode GGE1 or the second ground select gate electrode GGE2. The electrode portions EP of the cell gate electrodes CGE may be positioned below the pad portion PAD of each of the lower and upper string select gate electrodes SGEa and SGEb.

In exemplary embodiments of the present inventive concept, when viewed in a plan view, the pad portions PAD of the first and second ground select gate electrodes GGE1 and GGE2 may be disposed closer than the pad portions PAD of the cell gate electrodes CGE to the cell array region CAR. For example, a distance in the first direction D1 from the cell array region CAR to the pad portions PAD of the first and second ground select gate electrodes GGE1 and GGE2 may be less than a distance in the first direction D1 from the cell array region CAR to the pad portions PAD of the cell gate electrodes CGE. Therefore, when the through line structure (see TVS of FIG. 3) is formed to penetrate a portion of the electrode structure ST, the first and second ground select gate electrodes GGE1 and GGE2 may not be separated in the first direction D1 from each other by the through line structure (see TVS of FIG. 3). In this case, the first and second ground select gate electrodes GGE1 and GGE2 may be supplied with voltages through contact plugs.

Furthermore, when viewed in a plan view, the pad portions PAD of the first and second ground select gate electrodes GGE1 and GGE2 may be positioned between the pad portions PAD of the lower and upper string select gate electrodes SGEa and SGEb and the pad portions PAD of the cell gate electrodes CGE. For example, the pad portions PAD of the first and second ground select gate electrodes GGE1 and GGE2 may be spaced apart by a first distance A1 in the first direction D1 from the pad portions PAD of the lower string select gate electrodes SGEa. The pad portion PAD of an uppermost cell gate electrode CGE may be spaced apart by a second distance A2, which is greater than the first distance A1, in the first direction D1 from the pad portions PAD of the lower string select gate electrodes SGEa.

In exemplary embodiments of the present inventive concept, the through line structure (see TVS of FIG. 3) may penetrate a portion of the electrode structure ST on the connection region CNR, and may be adjacent in the first direction D1 to the pad portions PAD of the first and second ground select gate electrodes GGE1 and GGE2. In addition, the through line structure (see TVS of FIG. 3) may be provided between a pair of line portions LP of each cell gate electrode CGE.

The following will describe in detail a three-dimensional semiconductor memory device including the electrode structure ST and the through line structure (see TVS of FIG. 3).

FIG. 5 is a plan view showing a three-dimensional semiconductor memory device according to exemplary embodiments of the present inventive concept. FIGS. 6A to 6D are cross-sectional views respectively taken along lines I-I', II-II', III-III', and IV-IV' of FIG. 5, showing a three-dimensional semiconductor memory device according to exemplary embodiments of the present inventive concept. FIG. 6E is an enlarged view showing section A of FIG. 6D.

Referring to FIGS. 5 and 6A a three-dimensional semiconductor memory device according to exemplary embodiments of the present inventive concept may include a peripheral logic structure PS and a cell array structure CS on the peripheral logic structure PS.

The peripheral logic structure PS may include peripheral logic circuits PTR integrated on an entire surface of a semiconductor substrate 10 and also include a lower buried dielectric layer 50 covering the peripheral logic circuits PTR. The semiconductor substrate 10 may be a silicon substrate. The semiconductor substrate 10 may include active regions between device isolation layers 11. The peripheral logic circuits PTR may be row and column decoders, a page buffer, a control circuit, and the like. For example, the peripheral logic circuits PTR may include n-type metal oxide semiconductor (NMOS) and p-type metal oxide semiconductor (PMOS) transistors. Peripheral circuit lines 33 may be electrically connected through peripheral contact plugs 31 to the peripheral logic circuits PTR.

The lower buried dielectric layer 50 may be provided on the entire surface of the semiconductor substrate 10. On the semiconductor substrate 10, the lower buried dielectric layer 50 may cover the peripheral logic circuits PTR, the peripheral contact plugs 31, and the peripheral circuit lines 33. The lower buried dielectric layer 50 may include a plurality of stacked dielectric layers.

Referring again to FIGS. 5 and 6A, the cell array structure CS may include a horizontal layer 100, an electrode structure ST that extends along a first direction D1 from a cell array region CAR to a connection region CNR on the horizontal layer 100, and vertical semiconductor patterns VS that penetrate the electrode structure ST on the cell array region CAR.

The horizontal layer 100 may include the cell array region CAR and the connection region CNR. In other exemplary embodiments of the present inventive concept, as discussed with reference to FIG. 3, the horizontal layer 100 may include a first connection region CNR1, a second connection region CNR2, and a cell array region CAR between the first and second connection regions CNR1 and CNR2. The horizontal layer 100 may be disposed on a top surface of the lower buried dielectric layer 50. The horizontal layer 100 may be formed of a semiconductor material, a dielectric material, or a conductive material. The horizontal layer 100 may include a semiconductor material doped with impurities having a first conductive type (e.g., n-type) and/or an intrinsic semiconductor material doped with no impurities.

As shown in FIG. 5, the electrode structure ST may be disposed between first electrode separation structures ESS1. The first electrode separation structures ESS1 may extend along the first direction D1 from the cell array region CAR to the connection region CNR, and may be spaced apart from each other in a second direction D2 intersecting the first direction D1. A second electrode separation structure ESS2 may penetrate the electrode structure ST between the first electrode separation structures ESS1. The second electrode separation structure ESS2 may have a length in the first direction D1 less than that of the first electrode separation structure ESS1. A single second electrode separation structure ESS2 is illustrated in certain exemplary embodiments of the present inventive concept, but in other exemplary embodiments of the present inventive concept, a plurality of second electrode separation structures may be provided between the first electrode separation structures ESS1.

Referring to FIG. 6A, the electrode structure ST may include a source structure SST on the horizontal layer 100, a lower electrode structure LST on the source structure SST, a cell electrode structure CST on the lower electrode structure LST, and an upper electrode structure UST on the cell electrode structure CST, The lower electrode structure LST, the cell electrode structure CST, and the upper electrode structure UST may have the same characteristics discussed with reference to FIG. 4, and thus, explanations thereof may be omitted.

Referring again to FIG. 6A, the source structure SST may include a source conductive pattern SC and a support conductive pattern SP on the source conductive pattern SC. A dielectric layer may be interposed between the source conductive pattern SC and the support conductive pattern SP. The source structure SST may be parallel to a top surface of the horizontal layer 100, and may extend in the first direction D1 parallel to the cell electrode structure CST on the cell array region CAR.

The source conductive pattern SC may be formed of a semiconductor material doped with first conductive type impurities (e.g., phosphorous (P) or arsenic (As)) For example, the source conductive pattern SC may be formed of a semiconductor layer doped with n-type impurities. On the cell array region CAR, the source conductive patterns SC may contact sidewalls of the vertical semiconductor patterns VS. This will be further discussed in detail with reference to FIG. 6E.

The support conductive pattern SP may cover a top surface of the source conductive pattern SC, and may include a semiconductor material doped with impurities having a first conductive type (e.g., n-type) and/or an intrinsic semiconductor material doped with no impurities.

Referring still to FIG. 6A, a buried dielectric layer 110 may be disposed on the horizontal layer 100 on the connection region CNR, covering a sidewall of the source structure SST. The buried dielectric, layer 110 may have a top surface substantially coplanar with that of the source structure SST.

Referring yet still to FIG. 6A, the lower electrode structure LST may be disposed on the source structure SST and the buried dielectric layer 110. The lower electrode structure LST may extend along the first direction D1 from the cell array region CAR to the connection region CNR.

The lower electrode structure LST may include lower electrodes EGEa, EGEb, GGE1, and GGE2 (see also FIG. 6B) and lower dielectric layers ILDa that are vertically and alternately stacked, and also include a lower planarized dielectric layer 120 covering the lower electrodes EGEa, EGEb, GGE1, and GGE2. In addition, the lower electrode structure LST may include lower mold patterns LMP located at levels the same as those of the lower electrodes EGEa, EGEb, GGE1, and GGE2. The lower mold patterns LMP may have a stepwise structure, and a pad mold pattern (see PP of FIG. 6B) may be disposed on each lower mold pattern LMP between pad portions PAD that are adjacent to each other in the second direction D2.

The lower electrodes EGEa EGEb, GGE1, and GGE2 may have lengths in the first direction D1 that decrease as the distance from the horizontal layer 100 increases. Each of the lower electrodes EGEa, EGEb, GGE1, and GGE2 may have a pad portion PAD on the connection region CNR, and the pad portions PAD of the lower electrodes EGEa, EGEb, GGE1, and GGE2 may be located at positions horizontally and vertically different from each other, For example, the lower electrodes EGEa, EGEb, GGE1, and GGE2 may include lower and upper erase gate electrodes EGEa and EGEb that are sequentially stacked, and also include first and second ground select gate electrodes GGE1 and GGE2 that are horizontally spaced apart from each other. As another example, the lower electrode structure LST may include neither the lower erase gate electrode EGEa nor the tipper erase gate electrode EGEb.

Referring once more to FIG. 6A, similar to the cell gate electrodes CGE discussed above with reference to FIG. 4, each of the lower and upper erase gate electrodes EGEa and EGEb may include electrode portions that extend in the first direction D1 on the cell array region CAR, a connection portion that horizontally connects the electrode portions to each other, line portions that extend in the first direction D1 from the connection portion, and pad portions PAD that protrude in the second direction D2 from the line portions. The line portion and the pad portion PAD of each of the lower and upper erase gate electrodes EGEa and EGEb may be adjacent to the lower mold pattern LMP on the connection region CNR, and the pad portion PAD may have a thickness greater than that of the line portion.

The lower and upper erase gate electrodes EGEa and EGEb may each be used as a gate electrode of the erase control transistor (see ECT of FIG. 2) that generates a gate induced drain leakage (GIDL).

Figure 6B:
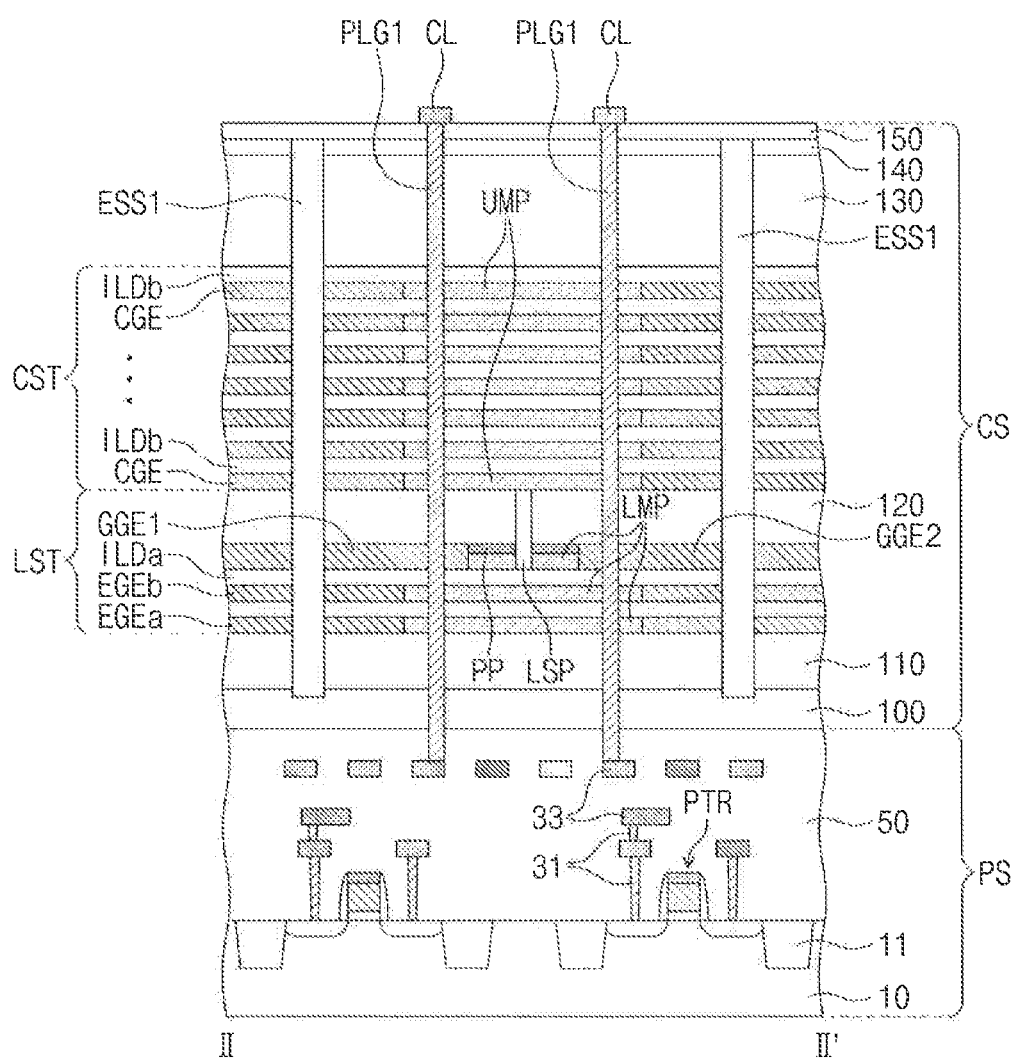

Referring to FIGS. 6A and 6B, on the upper erase gate electrode EGEb, the first and second ground select gate electrodes GGE1 and GGE2 may extend in the first direction D1 and may be spaced apart from each other in the second direction D2, The first and second ground select gate electrodes GGE1 and GGE2 may be used as gate electrodes of the ground select transistors (see GST of FIG. 2) that control an electrical connection between the source conductive pattern SC and the vertical semiconductor patterns VS.

Each of the first and second ground select gate electrodes GGE1 and GGE2 may have a length in the first direction D1 greater than that of the second electrode separation structure ESS2 shown in FIG. 5. The first and second ground select gate electrodes GGE1 and GGE2 may be horizontally separated from each other by a lower separation pattern LSP on the connection region CNR and by the second electrode separation structure ESS2 on the cell array region CAR.

Referring to FIG. 6B, each of the first and second ground select gate electrodes GGE1 and GGE2 may include a line portion and a pad portion (see PAD of FIG. 6A) each of which is adjacent to the lower mold pattern LMP on the connection region CNR, and the pad portion PAD may have a thickness greater than that of the line portion.

Referring to FIGS. 5, 6A, and 6B, when viewed in a plan view, the pad portions PAD of the first and second ground select gate electrodes GGE1 and GGE2 may overlap upper mold patterns UMP of the cell electrode structure CST. In addition, when viewed in a plan view, the pad portions PAD of the first and second ground select gate electrodes GGE1 and GGE2 may overlap the lower mold patterns LMP.

As shown in FIG. 6A, each of the first and second ground select gate electrodes GGE1 and GGE2 may further include a dummy pad portion DM that is spaced apart in the first direction D1 from the pad portion PAD thereof and is adjacent to the pad portions PAD of the lower and upper erase gate electrodes EGEa and EGEb. The dummy pad portion DM may have the same thickness as that of the pad portion PAD.

As illustrated in FIG. 6A, on the connection region CNR, the lower separation pattern LSP may penetrate the lower planarized dielectric layer 120 and an uppermost one of the lower mold patterns LMP. The pad portion PAD of each of the first and second ground select gate electrodes GGE1 and GGE2 may be disposed closer to the cell array region CAR than the lower separation pattern LSP.

As shown in FIG. 5, when viewed in a plan view, the lower separation pattern LSP may include a first part P1 that extends in the second direction D2 and a second part P2 that protrudes in the first direction D1 from the first part P1 toward the cell array region CAR. The second part P2 may contact the second electrode separation structure ESS2. For example, the second part P2 may contact an end portion of the second electrode separation structure ESS2.

The first part P1 of the lower separation pattern LSP may contact sidewalls of the pad portions PAD of the first and second ground select gate electrodes GGE1 and GGE2 adjacent to each other in the second direction D2. The second part P2 of the lower separation pattern LSP may be disposed between the first and second ground select gate electrodes GGE1 and GGE2 adjacent to each other in the second direction D2.

As depicted in FIG. 6A, the cell electrode structure CST may be disposed on the lower planarized dielectric layer 120. The cell electrode structure CST may extend along the first direction D1 from the cell array region CAR to the connection region CNR.

The cell electrode structure CST may include cell gate electrodes CGE and intermediate dielectric layers ILDb that are vertically and alternately stacked on the lower planarized dielectric layer 120. The cell gate electrodes CGE may be used as the word lines (see WL0 to WLn and DWL of FIG. 2) of the memory cell transistors (MCT of FIG. 2). In addition, the cell electrode structure CST may include the upper mold patterns UMP on the connection region CNR that are located at the same levels as the cell gate electrodes CGE. The upper mold patterns UMP may have a stepwise shape, and a pad mold pattern (see PP of FIG. 6C) may be disposed on each upper mold pattern UMP between pad portions PAD that are adjacent to each other in the second direction D2. The cell gate electrodes CGE may have lengths in the first direction D1 that decrease as the distance from the horizontal layer 100 increases.

Each cell gate electrode CGE may have a line portion and a pad portion PAD that are adjacent to the upper mold pattern UMP on the connection region CNR, and the pad portion PAD may have a thickness greater than that of the line portion. When viewed in a plan view, the pad portions PAD of the cell gate electrodes CGE may overlap the upper mold patterns LIMP. The upper mold pattern UMP may be positioned below the pad portion PAD of each cell gate electrode CGE, and the pad portion PAD of each cell gate electrode CGE may have a top surface covered with an upper planarized dielectric layer 130.

As described in FIG. 6A, the upper electrode structure UST may include upper electrodes SGEa, SGEb, and EGE and upper dielectric layers ILDc that are vertically and alternately stacked on the cell electrode structure CST. The upper electrode structure UST may extend along the first direction D1 from the cell array region CAR to the connection region CNR.

The upper electrodes SGEa SGEb, and EGE may have lengths in the first direction D1 that decrease as the distance from the horizontal layer 100 increases. An upper separation pattern USP on the cell electrode structure CST may separate the upper electrodes SGEa, SGEb, and EGE from each other in the second direction D2.

In exemplary embodiments of the present inventive concept, the upper electrodes SGEa, SGEb, and EGE may include lower and upper string select gate electrodes SGEa and SGEb and an erase gate electrode EGE that are sequentially stacked. The lower and upper string select gate electrodes SGEa and SGEb may be used as gate electrodes of the string select transistors (see SST1 and SST2 of FIG. 2) that control electrical connections between a bit line BL and the vertical semiconductor patterns VS.

As demonstrated in FIG. 6A, the upper planarized dielectric layer 130 may cover the cell electrode structure CST and the upper electrode structure UST. The upper planarized dielectric layer 130 may have a substantially planarized top surface. The upper planarized dielectric layer 130 may include a single dielectric layer or a plurality of stacked dielectric layers. First and second interlayer dielectric layers 140 and 150 may be sequentially stacked on the upper planarized dielectric layer 130.

Referring again to FIGS. 5, 6A and 6B, on the connection region CNR, first contact plugs PLG1 may penetrate the upper mold patterns UMP of the cell electrode structure CST and may be coupled to corresponding pad portions PAD of the first and second ground select gate electrodes GGE1 and GGE2. The first contact plugs PLG1 may continuously extend in a third direction D3 and may penetrate the lower mold patterns LMP below the first and second ground select gate electrodes GGE1 and GGE2. Furthermore, the first contact plugs PLG1 may be connected to the peripheral circuit lines 33 of the peripheral logic structure PS.

Figure 6C:
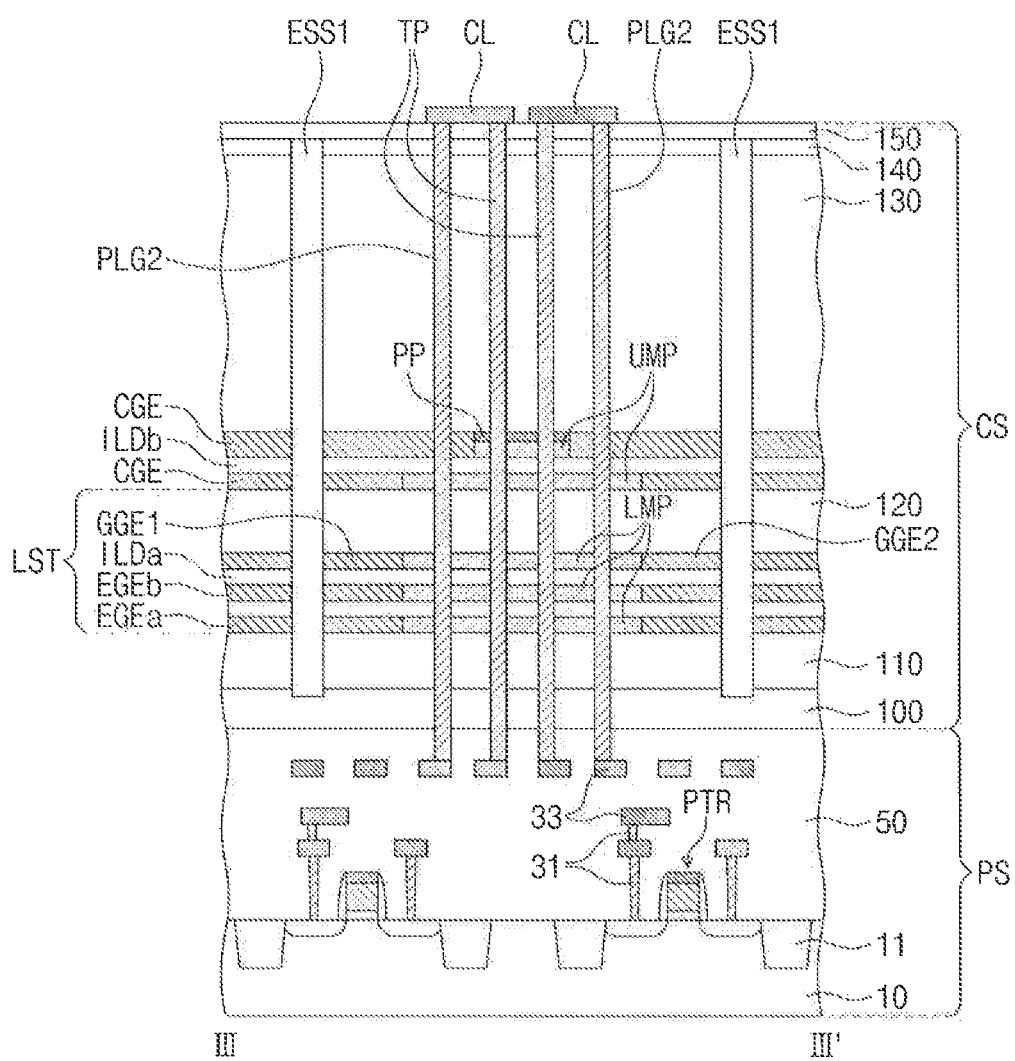

Referring to FIGS. 5, 6A, and 6C, on the connection region CNR, second contact plugs PLG2 may penetrate the upper planarized dielectric layer 130 and may be coupled to corresponding pad portions PAD of the cell gate electrodes CGE. The second contact plugs PLG2 may continuously extend in the third direction D3 and may penetrate the upper mold patterns UMP of corresponding cell gate electrodes CGE and lower mold patterns LMP below the corresponding cell gate electrodes CGE. Furthermore, the second contact plugs PLG2 may be connected to the peripheral circuit lines 33 of the peripheral logic structure PS.

Referring still to FIGS. 5, 6A, and 6B, on the connection region CNR, third contact plugs PLG3 may penetrate the upper planarized dielectric layer 130 and may be coupled to corresponding pad portions PAD of the lower and upper erase gate electrodes EGEa and EGEb. The third contact plugs PLG3 may continuously extend in the third direction D3 and may penetrate the lower mold pattern LMP below the upper erase gate electrode EGEb. The third contact plugs PLG3 may continuously extend in the third direction D3 and may be connected to the peripheral circuit lines 33 of the peripheral logic structure PS.

Referring again to FIGS. 5, 6A, and 6C, on the connection region CNR, fourth contact plugs PLG4 may penetrate the tapper planarized dielectric layer 130 and may be coupled to corresponding pad portions PAD of the lower and upper string select gate electrodes SGEa and SGEb.

The first to fourth contact plugs PLG1 to PLG4 may have their top surfaces at substantially the same level. In exemplary embodiments of the present inventive concept, the first, second, and third contact plugs PLG1, PLG2, and PLG3 are illustrated to have substantially the same length in the third direction D3, but the present inventive concept is not limited thereto.

On the connection region CNR, through plugs TP may penetrate the upper planarized dielectric layer 130 and the upper and lower mold patterns UMP and LMP, and may be connected to the peripheral circuit lines 33 of the peripheral logic structure PS. Each of the through plugs TP may be connected through a connection line CL to one of the first to fourth contact plugs PLG1 to PLG4.

Figure 6D:
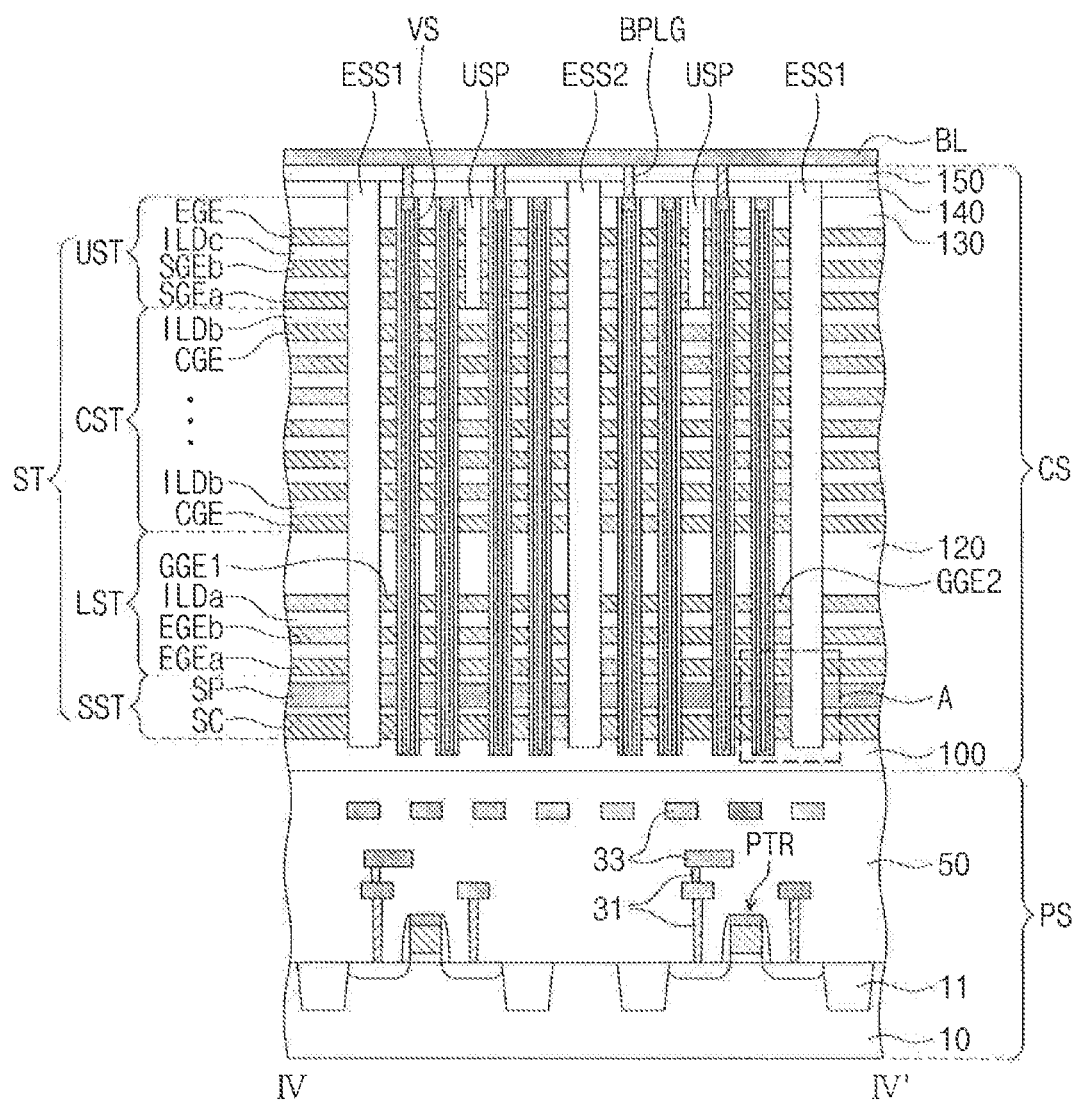
Figure 6E:
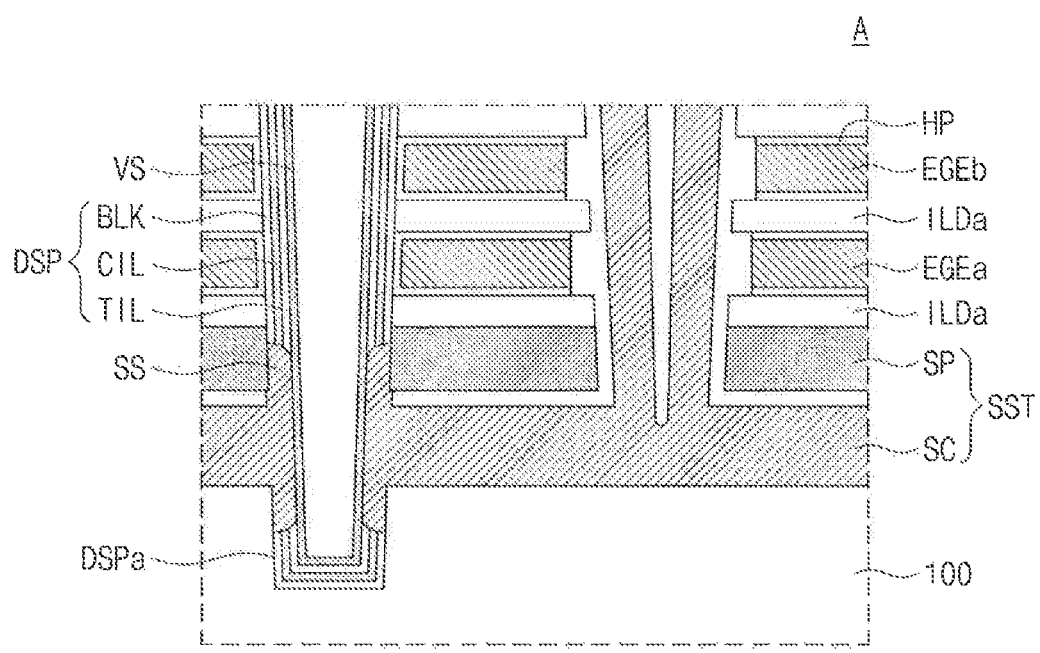
FIG. 6E is an enlarged view showing section A of FIG. 6D.

Referring to FIGS. 6A and 6D, on the cell array region CAR, the second interlayer dielectric layer 150 may be provided thereon with bit lines BL extending in the second direction D2 across the electrode structure ST. The bit lines BL may be electrically connected through bit line contact plugs BPLG to the vertical semiconductor patterns VS.

Referring to FIGS. 5, 6A, and 6D, the vertical semiconductor patterns VS may be disposed on the horizontal layer 100 of the cell array region CAR. The vertical semiconductor patterns VS may extend in the third direction D3 substantially perpendicular to a top surface of the semiconductor substrate 10, and may penetrate the upper electrode structure UST, the cell electrode structure CST, the lower electrode structure LST, and the source structure SST.

Referring to FIG. 6E, the vertical semiconductor patterns VS may each have a lower sidewall in direct contact with the source structure SST. For example, the vertical semiconductor pattern VS may contact a sidewall SS of the source conductive pattern SC. The vertical semiconductor patterns VS may have a macaroni shape or a pipe shape whose bottom end is closed. The vertical semiconductor patterns VS may include a semiconductor material, such as silicon (Si), germanium (Ge), or a mixture thereof. The vertical semiconductor patterns VS including a semiconductor material may be used as channels of the erase control transistor ECT, the string select transistors SST1 and SST2, the ground select transistor GST, and the memory cell transistors MCT discussed with reference to FIG. 2. On the connection region CNR, dummy semiconductor patterns may have the same structure as that of the vertical semiconductor patterns VS and may penetrate the cell electrode structure CST and the lower electrode structure LST.

A data storage pattern DSP may extend in the third direction D3 and may surround a sidewall of each vertical semiconductor pattern VS. The data storage pattern DSP may have a macaroni shape or a pipe shape whose top and bottom ends are opened. Referring to FIG. 6E, the data storage pattern DSP may have a bottom surface at a lower level than a bottom surface of the lower erase gate electrode EGEa, and may be disposed on the sidewall SS of the source conductive pattern SC. The data storage pattern DSP may be formed of a single thin layer or a plurality of thin layers. In exemplary embodiments of the present inventive concept, the data storage pattern DSP may include a Wand dielectric layer TIL, a charge storage layer CIL and a blocking dielectric layer BLK, which are sequentially stacked on a sidewall of the vertical semiconductor pattern VS and which constitute a data storage layer of a NAND Flash memory device. For example, the charge storage layer CIL may be a trap dielectric layer, a floating gate electrode, or a dielectric layer including conductive nano-dots. Additionally, the horizontal layer 100 may include therein a dummy data storage pattern DPSa vertically spaced apart from the data storage pattern DSP. The dummy data storage pattern DPSa may be disposed at the bottom of the vertical semiconductor pattern VS.

A horizontal dielectric pattern HP may be provided between the data storage pattern DSP and sidewalls of electrodes. The horizontal dielectric pattern HP may extend onto top and bottom surfaces of the electrode from the one sidewalls of the electrodes.

In exemplary embodiments of the present inventive concept, elements on the connection region CNR which are discussed with reference to FIGS. 4, 5, and 6A to 6E may be identically applicable to the first and second connection regions CNR1 and CNR2 shown in FIG. 3. For example, each electrode may have a pad portion positioned on each of the first and second connection regions CNR1 and CNR2, and may be supplied with operating voltages through the pad portions on the first and second connection regions CNR1 and CNR2.

For example, an electrode structure may include first mold patterns at the same levels as electrodes on the first connection region CNR1 and also include second mold patterns at the same levels as electrodes on the second connection region CNR2. Each electrode may include an electrode portion on the cell array region CAR, a first pad portion on the first connection region CNR1, and a second pad portion on the second connection region CNR2. When viewed in a plan view, the first pad portions of the electrodes may overlap the first mold patterns, and the second pad portions of the electrodes may overlap the second mold patterns.

As discussed above, because the pad portions of the electrodes and a through line structure are provided on the first and second connection regions CNR1 and CNR2 on opposite sides of the cell array region CAR, contact plugs may be coupled to the electrodes on the first and second connection regions CNR1 and CNR2. Therefore, because opposite ends of each electrode are supplied with operating voltages, it is possible to increase transfer speeds of signals applied to the electrodes. It is also possible to increase the freedom of design of connection lines coupled to electrodes included in the electrode structure ST.

FIGS. 7 to 11 are cross-sectional views taken along line I-I' of FIG. 5, showing a three-dimensional semiconductor memory device according to exemplary embodiments of the present inventive concept. For brevity of description, features of the three-dimensional semiconductor memory device discussed with reference to FIGS. 5 and 6A to 6E may not be described again.

Figure 7:
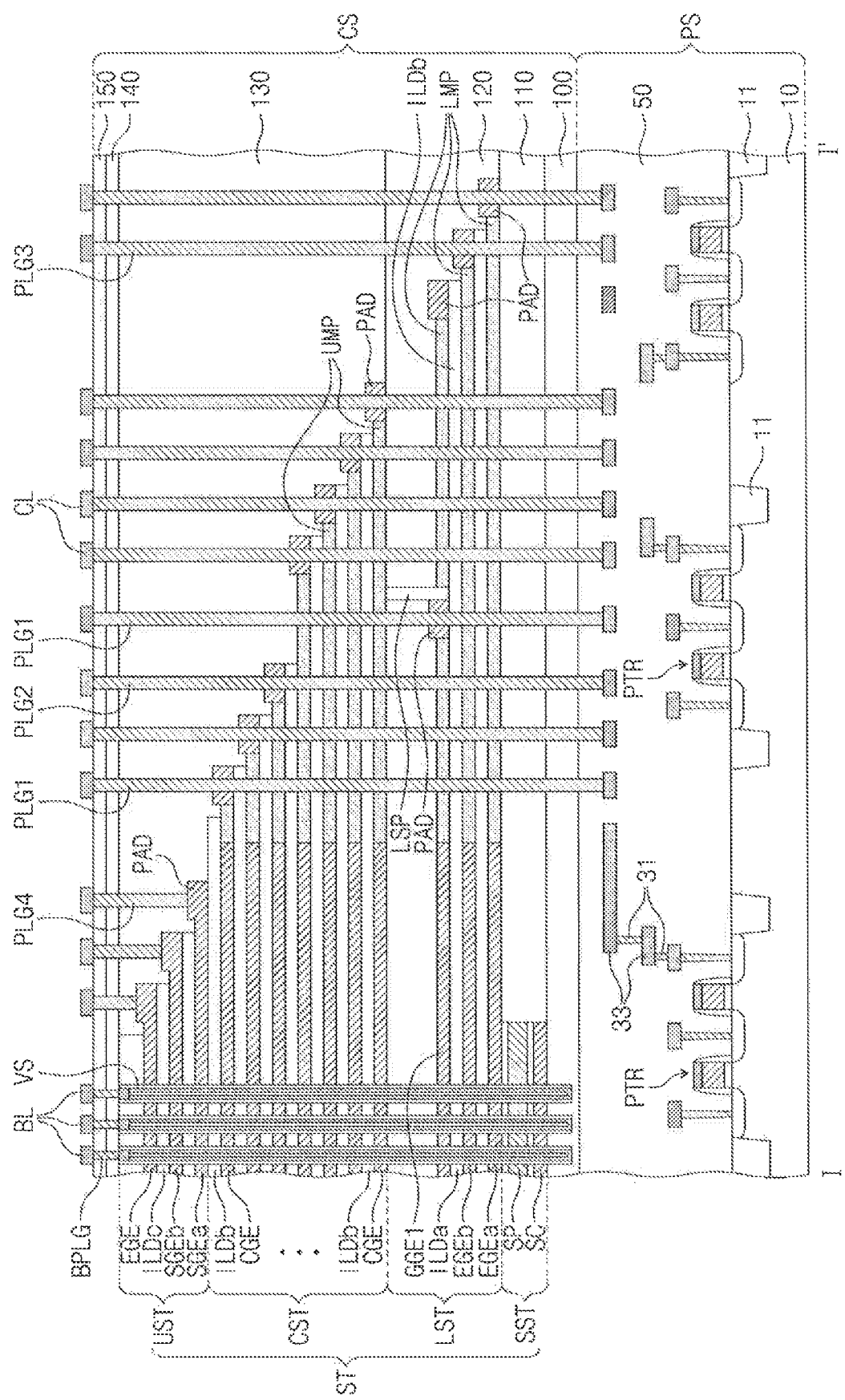
FIGS. 7, 8, 9, 10 and 11 are cross-sectional views taken along line I-I' of FIG. 5, showing a three-dimensional semiconductor memory device according to exemplary embodiments of the present inventive concept.

Referring to FIG. 7, when viewed in a plan view, the pad portion PAD of the first or second ground select gate electrode GGE1 or GGE2 may be positioned between the pad portions PAD of neighboring cell gate electrodes CGE. For example, the first contact plug PLG1 coupled to the first or second ground select gate electrode GGE1 or GGE2 may he disposed between neighboring second contact plugs PLG2.

Figure 8:
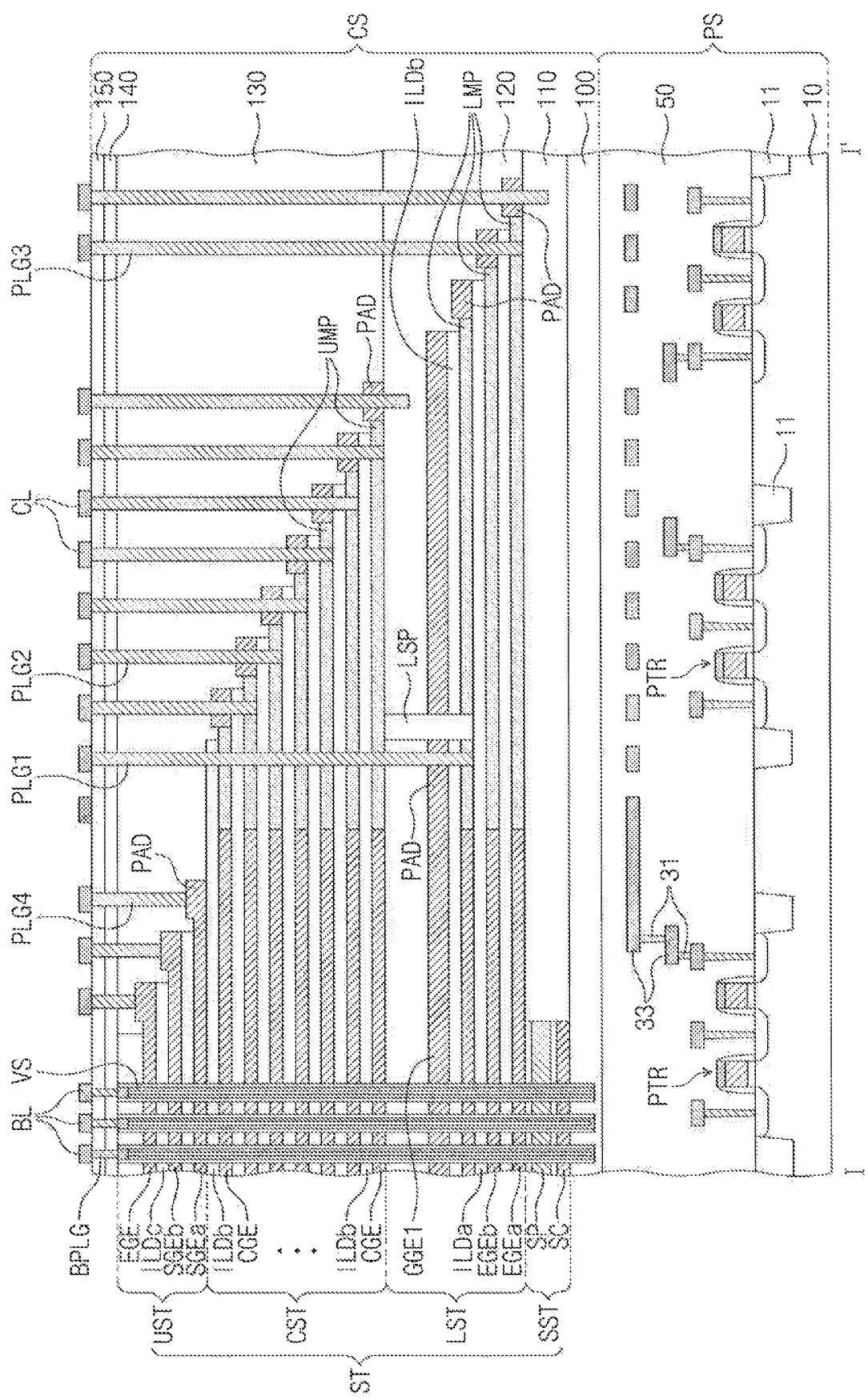

Referring to FIG. 8, each of the first and second ground select gate electrodes GGE1 and GGE2 may have a substantially uniform thickness on the cell array region CAR and the connection region CNR. The first and second ground select gate electrodes GGE1 and GGE2 may he thicker than each cell gate electrode CGE.

The first and second ground select gate electrodes GGE1 and GGE2 may have lengths in the first direction D1 less than those of the cell gate electrodes CGE. The first and second ground select gate electrodes GGE1 and GGE2 may each have a distal end in contact with the lower separation pattern LSP. In other words, the lower separation pattern LSP may be disposed between the distal ends of the first and second ground select gate electrodes GGE1 and GGE2. A dummy electrode may be located at the same level as the first and second ground select gate electrodes GGE1 and GGE2, and when viewed in a plan view, may overlap the pad portions PAD of the cell gate electrodes CGE.

The first contact plug PLG1 may penetrate the upper mold patterns UMP between the pad portion PAD of the lower string select gate electrode SGEa and the pad portion PAD of a lowermost cell gate electrode CGCE, and may be coupled to one of the first and second ground select gate electrodes GGE1 and GGE2. The first contact plug PLG1 may penetrate one of the first and second ground select gate electrodes GGE1 and GGE2 and its underlying lower mold pattern LMP.

On the connection region CNR, the second contact plugs PLG2 may penetrate the upper planarized dielectric layer 130 and may be coupled to corresponding pad portions PAD of the cell gate electrodes CGE. The second contact plugs PLG2 may have their top surfaces at the same level, but may have different lengths in the third direction D3. Each of the second contact plugs PLG2 may penetrate the pad portion PAD of a corresponding cell gate electrode CGE, and may also penetrate the upper mold pattern UMP below the corresponding cell gate electrode CGE.

On the connection region CNR, the third contact plugs PLG3 may penetrate the upper planarized dielectric layer 130 and may be coupled to corresponding pad portions PAD of the lower and upper erase gate electrodes EGEa and EGEb. The third contact plugs PLG3 may have their top surfaces at the same level, but may have different lengths in the third direction D3. Each of the third contact plugs PLG3 may penetrate the pad portion PAD of a corresponding one of the lower and upper erase gate electrodes EGEa and EGEb, and may also penetrate the lower mold pattern LMP below the corresponding one of the lower and upper erase gate electrodes EGEa and EGEb. The first to fourth contact plugs PLG1 to PLG4 may be connected through the connection lines CL to corresponding through plugs TP.

Figure 9:
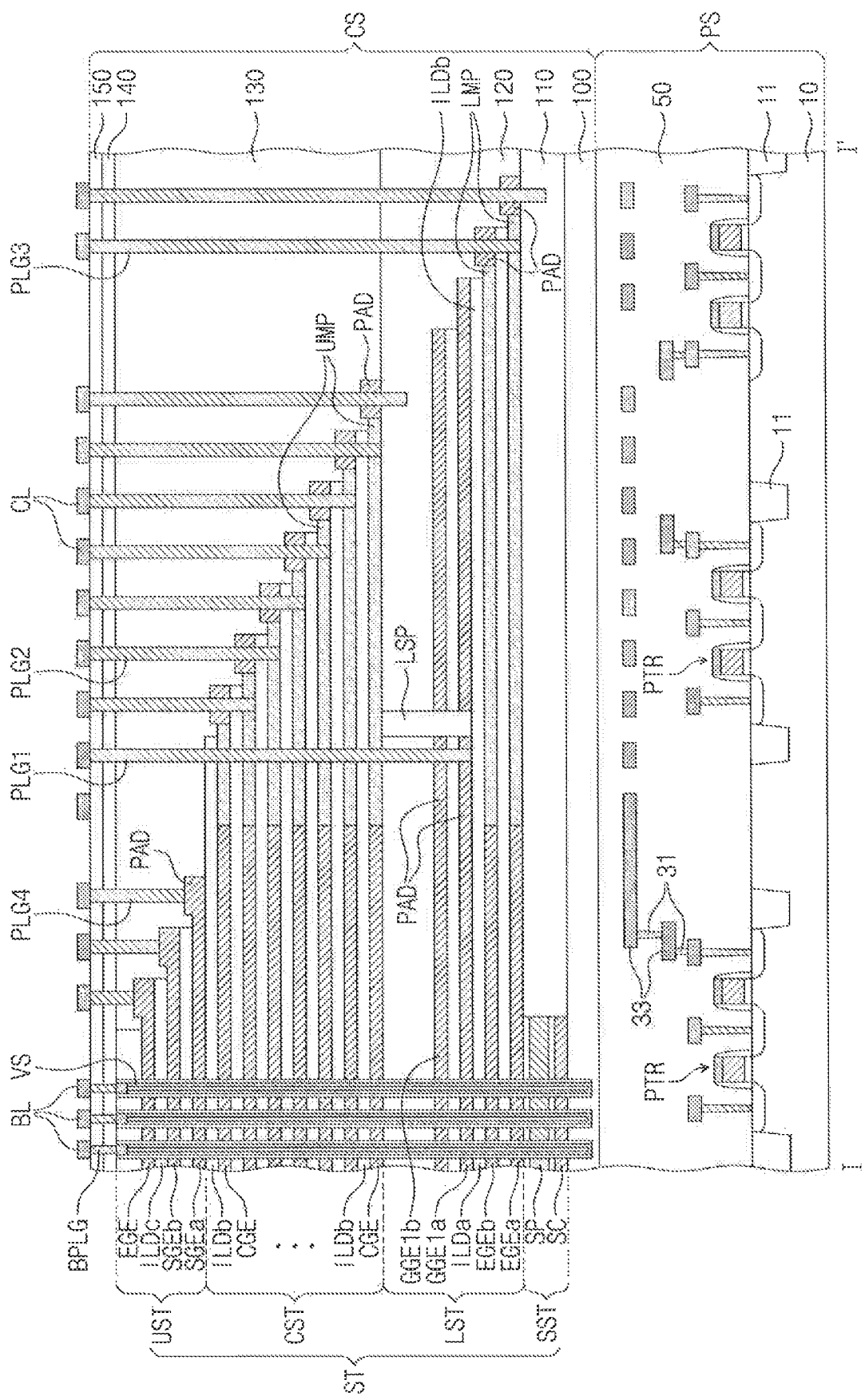

Referring to FIG. 9, the lower electrode structure LST may include lower and upper erase gate electrodes EGEa and EGEb and lower and upper around select gate electrodes GGE1a/GE2a and GGE1b/GGE2b that are sequentially stacked, The lower and upper around select gate electrodes GGE1a/GGE2a and GGE1b/GGE2b may each have a substantially uniform thickness on the cell array region CAR and the connection region CNR. The lower and upper ground select gate electrodes GGE1a/GGE2a and GGE1b/GGE2b may have substantially the same thickness as the cell gate electrodes CGE.

The first contact plugs PLG1 may penetrate the upper mold patterns UMP of the cell electrode structure CST and may be coupled to the lower and upper ground select gate electrodes GGE1a/GGE2a and GGE1b/GGE2b. The first contact plugs PLG1 may successively penetrate the lower and upper ground select gate electrodes GGE1a/GGE2a and GGE1b/GGE2b.

Figure 10:
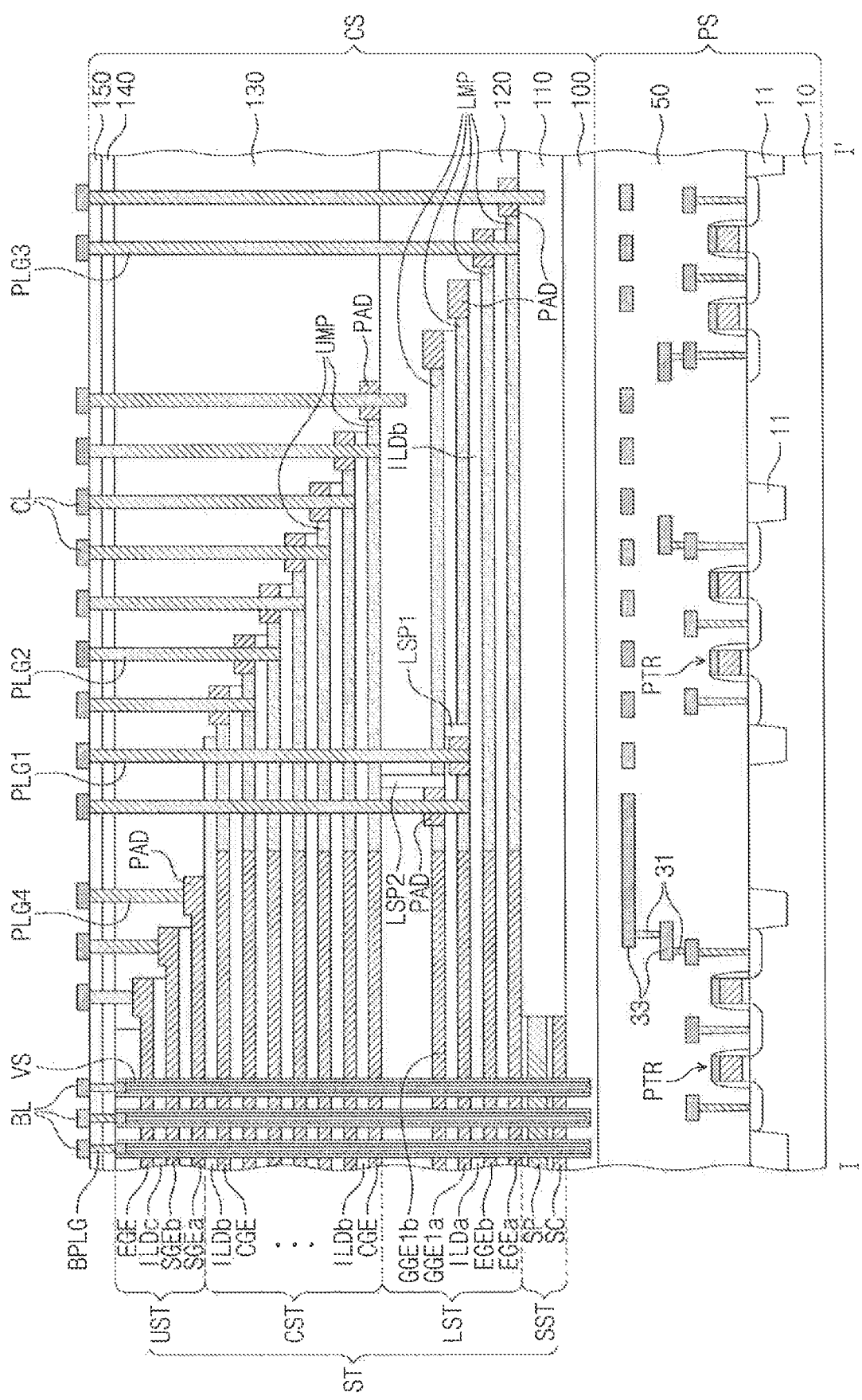
Figure 11:
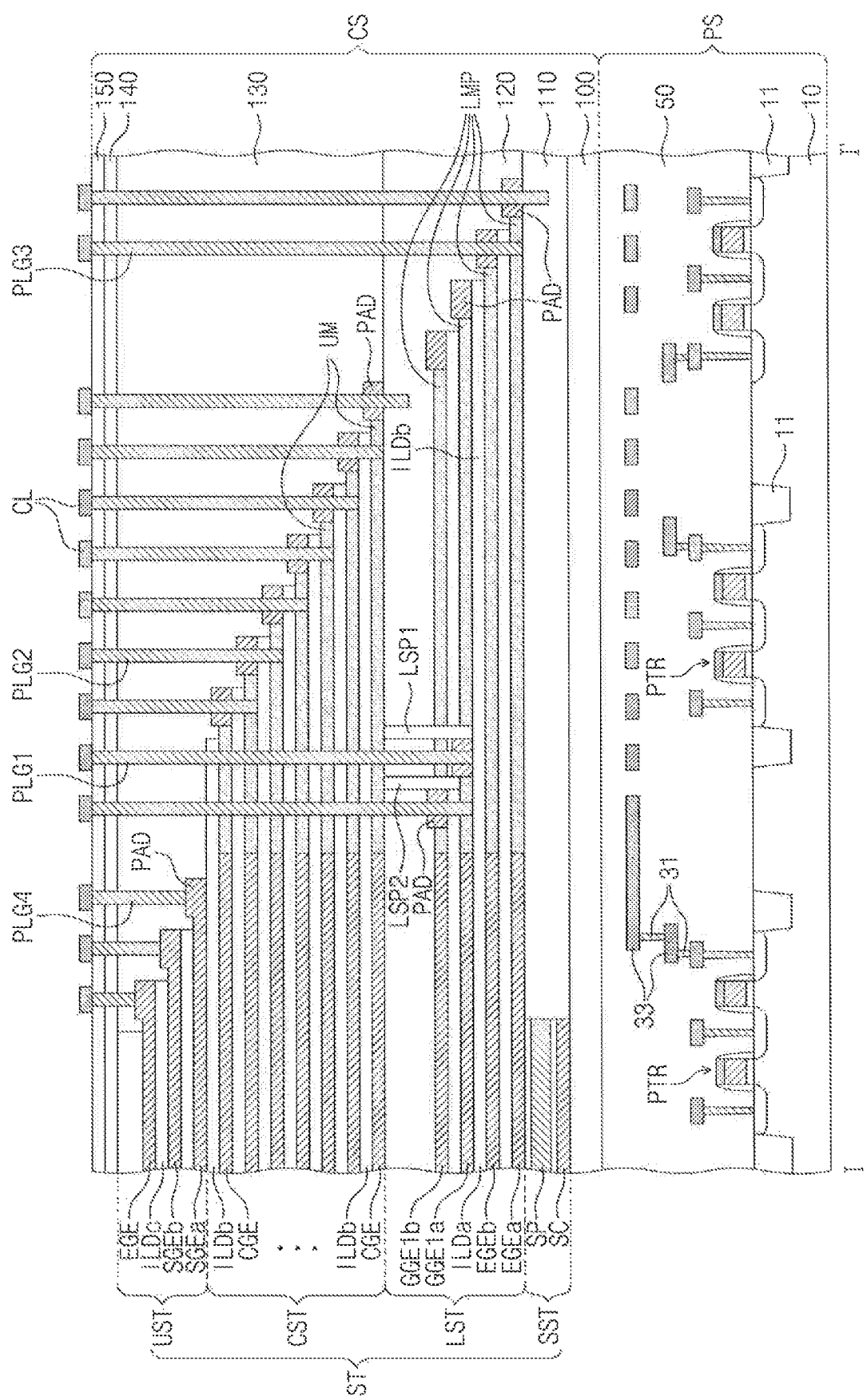

Referring to FIGS. 10 and 11, the lower electrode structure LST may include lower and upper erase gate electrodes EGEa and EGEb and lower and upper ground select gate electrodes GGE1a/GGE2a and GGE1b/GGE2b. Each of the lower and upper ground select gate electrodes GGE1a/GGE2a and GGEb/GGE2b may include, as discussed above, an electrode portion that extends in the first direction D1 on the cell array region CAR, a line portion that extends in the first direction D1 on the connection region CNR and has a width less than the electrode portion, and a pad portion PAD that protrudes in the second direction D2 from the line portion. In each of the lower and upper ground select gate electrodes GGE1a/GGE2a and GGE1b/GGE2b, the pad portion PAD may have a thickness greater than that of the electrode portion on the cell array region CAR.

When viewed in a plan view, the pad portions PAD of the lower and upper ground select gate electrodes GGE1a/GGE2a and GGE1b/GGE2b may be positioned between the pad portions PAD of the lower and upper string select gate electrodes SGEa and SGEb and the pad portions PAD of the cell gate electrodes CGE The pad portions PAD of the lower and upper ground select gate electrodes GGE1a/GGE2a and GGE1b/GGE2b may be placed at different distances from the cell array region CAR, and may be horizontally and vertically spaced apart from each other.

First and second lower separation patterns LSP1 and LSP2 may be adjacent to corresponding pad portions PAD of the lower and upper ground select gate electrodes GGE1a/GGE2a and GGE1b/GGE2b. The second lower separation pattern LSP2 may be disposed between the pad portions PAD of the lower and upper ground select gate electrodes GGE1a/GGE2a and GGE1b/GGE2b.

Referring to FIG. 10, the first and second lower separation patterns LSP1 and LSP2 may be located at different/levels. For example, the first and second lower separation patterns LSP1 and LSP2 may have their bottom surfaces at different levels and have their top surfaces also at different levels. In particular, the bottom surface of the first lower separation pattern LSP1 may be closer to an upper surface of the horizontal layer 100 than the bottom surface of the second lower separation pattern LSP2. Alternatively, referring to FIG. 11, the first and second lower separation patterns LSP1 and LSP2 may have their top surfaces at substantially the same level and have their bottom surfaces at different levels. The first and second lower separation patterns LSP1 and LSP2 may penetrate the lower planarized dielectric layer 120.

Referring again to FIGS. 10 and 11, the first contact plugs PLG1 may be coupled to corresponding pad portions PAD of the lower and upper ground select gate electrodes GGE1a/GGE2a and GGE1b/GGE2b, and may penetrate the lower mod pattern LMP below the pad portions PAD of the lower and upper ground select gate electrodes GGE1a/GGE2a and GGE1b/GGE2b.

Figure 12:
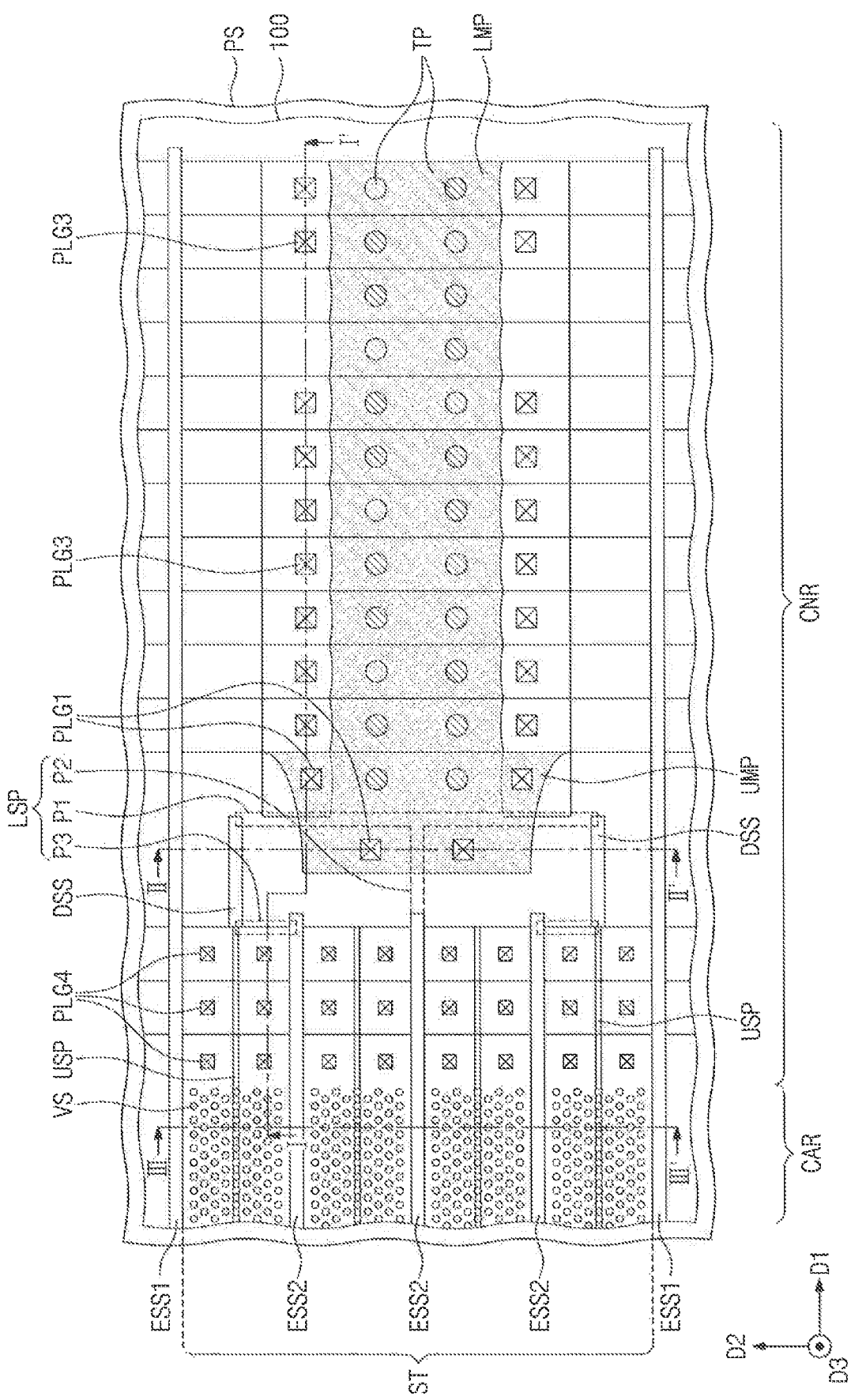
FIG. 12 is a plan view of a three-dimensional semiconductor memory device according to exemplary embodiments of the present inventive concept.
Figure 13A:
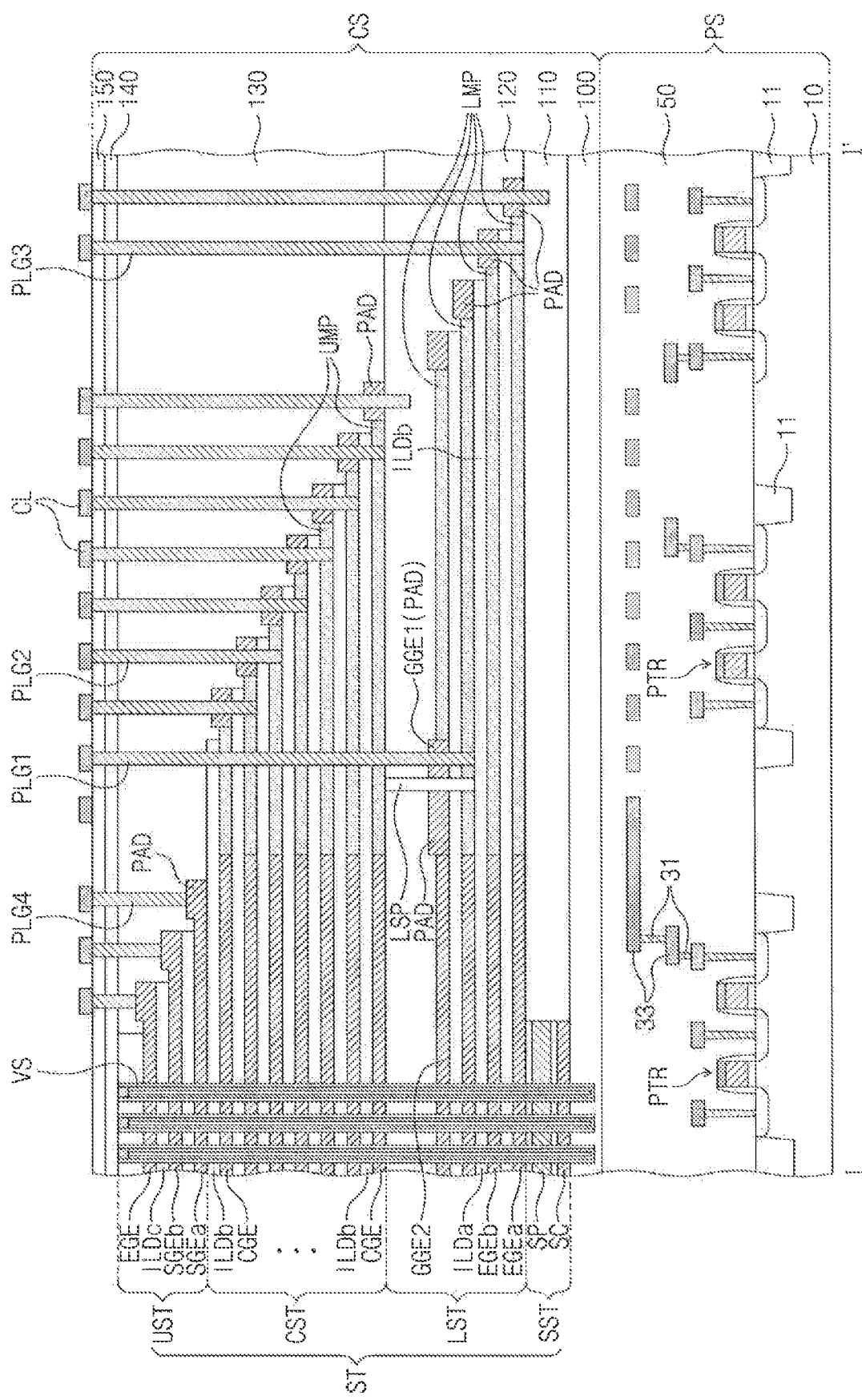
FIGS. 13A, 13B, and 13C are cross-sectional views respectively taken along lines I-I', II-II', and III-III' of FIG. 12, showing a three-dimensional semiconductor memory device according to exemplary embodiments of the present inventive concept.
Figure 13B:
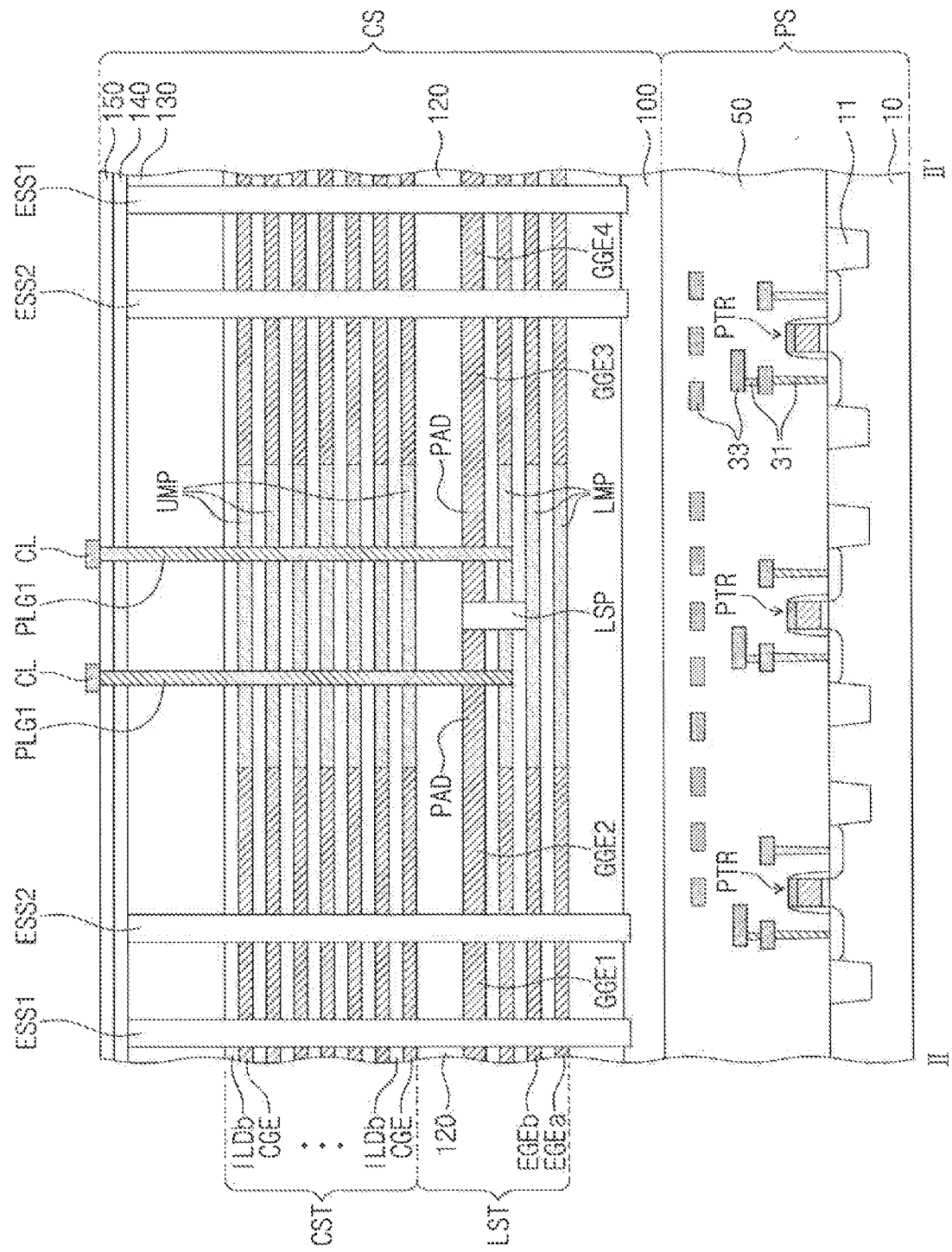
Figure 13C:
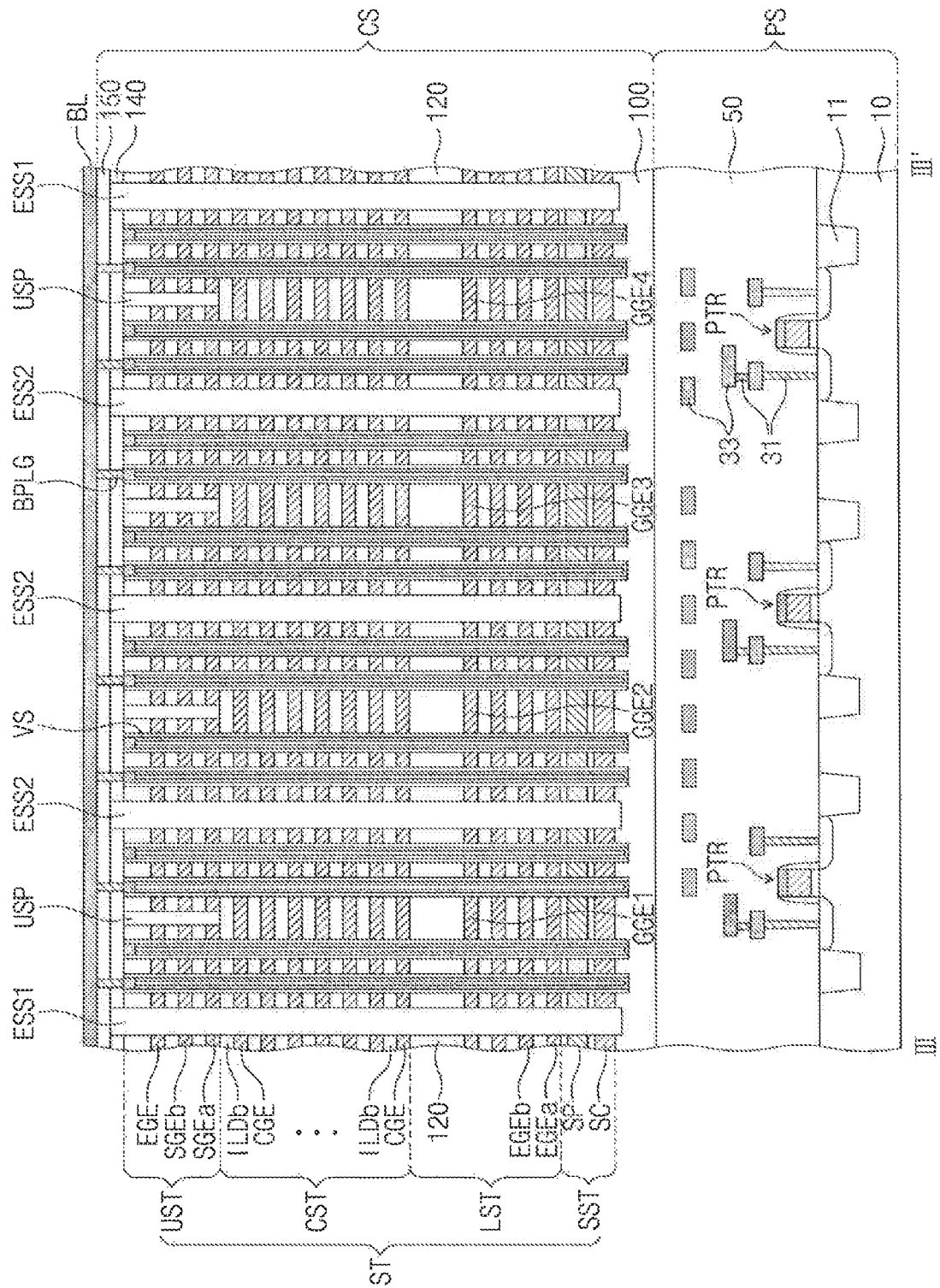
Figure 14:
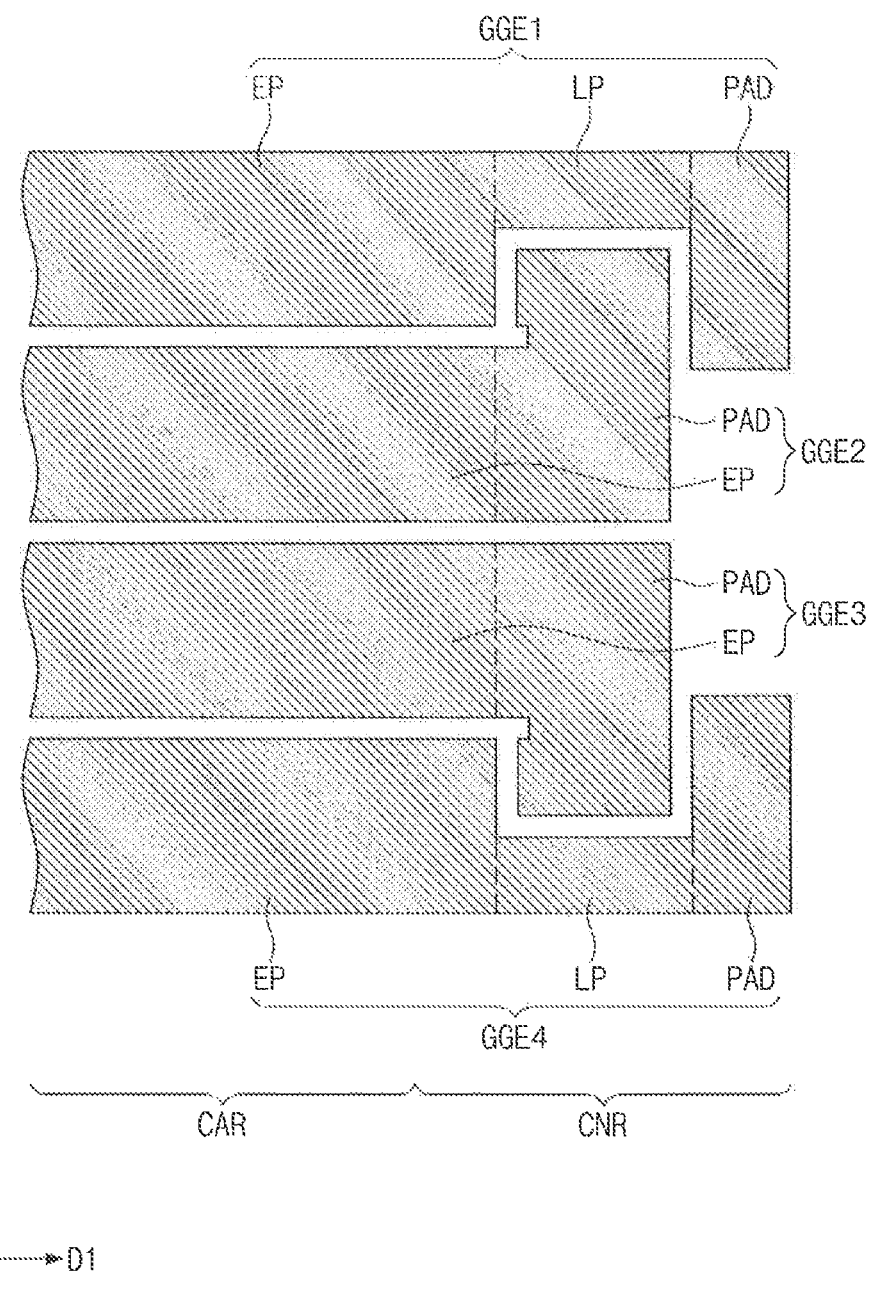
FIG. 14 is a plan view showing ground select electrodes of an electrode structure depicted in FIGS. 12 and 13A to 13C.

FIG. 12 is a plan view showing a three-dimensional semiconductor memory device according to exemplary embodiments of the present inventive concept. FIGS. 13A, 13B, and 13C are cross-sectional views respectively taken along lines I-I', II-II', and III-III' of FIG. 12, showing a three-dimensional semiconductor memory device according to exemplary embodiments of the present inventive concept. FIG. 14 is a plan view showing ground select electrodes of an electrode structure depicted in FIGS. 12 and 13A to 13C. For brevity of description, features the same as those of the three-dimensional semiconductor memory device discussed with reference to FIGS. 2 to 6E, may not be described hereafter.

Referring to FIGS. 12, 13A, 13B, and 13C, the electrode structure ST may include, as discussed above, the source structure SST on the horizontal layer 100, the lower electrode structure LST on the source structure SST, the cell electrode structure CST on the lower electrode structure LST, and the upper electrode structure UST on the cell electrode structure CST.

The electrode structure ST may be disposed between the first electrode separation structures ESS1. The first electrode separation structures ESS1 may extend along the first direction D1 from the cell array region CAR to the connection region CNR, and may be spaced apart from each other in the second direction D2 intersecting the first direction D1.

A plurality of second electrode separation structures ESS2 may be disposed between the first electrode separation structures ESS1. The second electrode separation structures ESS2 may penetrate the electrode structure ST, and may have lengths in the first direction D1 less than those of the first electrode separation structures ESS1.

On the connection region CNR, dummy electrode separation structures DSS may be spaced apart from the first and second electrode separation structures ESS1 and ESS2, and may penetrate the cell electrode structure CST and the lower electrode structure LST. The dummy electrode separation structures DSS may have their upper portions in contact with the upper separation pattern USP and have their lower portions in contact with the lower separation pattern LSP.

Referring to FIGS. 13B, 13C, and 14, the lower electrode structure LST may include first, second, third and fourth ground select gate electrodes GGE1, GGE2, GGE3 and GGE4 at the same level. The first to fourth ground select gate electrodes GGE1 to GGE4 may be separated and spaced apart from each other by the first and second electrode separation structures ESS1 and ESS2, the dummy electrode separation structures DSS, and the lower separation pattern LSP. In exemplary embodiments of the present inventive concept, a shape of the lower separation pattern LSP may be changed depending on the number of ground select gate electrodes included in a single electrode structure ST.

Referring to FIG. 14, each of the first and fourth ground select gate electrodes GGE1 and GGE4 may include an electrode portion EP that extends in the first direction D1 on the cell array region CAR, a line portion LP that extends in the first direction D1 on the connection region CNR and has a width less than that of the electrode portion EP, and a pad portion PAD that protrudes from the line portion LP in the second direction D2 intersecting the first direction D1. The first and fourth ground select gate electrodes GGE1 and GGE4 may have mirror-symmetry with respect to each other when viewed in a plan view.

Each of the second and third ground select gate electrodes GGE2 and GGE3 may include an electrode portion EP extending in the first direction D1 on the cell array region CAR and a pad portion PAD protruding in the second direction D2 from the electrode portion EP. The second and third ground select gate electrodes GGE2 and GGE3 may have mirror-symmetry with respect to each other when viewed in a plan view. The pad portion PAD of each of the first to fourth ground select gate electrodes GGE1 to GGE4 may be thicker than the electrode portion EP of each of the first to fourth ground select gate electrodes GGE1 to GGE4. The line and pad portions LP and PAD of the first and fourth ground select gate electrodes GGE1 and GGE4 may be adjacent to the lower mold pattern LMP on the connection region CNR.

Referring to FIGS. 12, 13A, and 13B, on the connection region CNR, the lower separation pattern LSP may penetrate the lower planarized dielectric layer 120 and an uppermost one of the lower mold patterns LMP. When viewed in a plan view, the lower separation pattern LSP may include a first part P1 that extends in the second direction D2, a second part P2 that protrudes in the first direction D1 from the first part P1 toward the cell array region CAR and that contacts the second electrode separation structure ESS2, and third pans P3 between the second electrode separation structures ESS2 and the dummy electrode separation structures DSS. The first part P1 of the lower separation pattern LSP may be disposed between the pad portions PAD of the first and second ground select gate electrodes GGE1 and GGE2 and the pad portions PAD of the third and fourth around select gate electrodes GGE3 and GGE4. The second part P2 of the lower separation pattern LSP may be disposed between the pad portions PAD of the second and third ground select gate electrodes GGE2 and GGE3. The third parts P3 of the lower separation pattern LSP may be adjacent to corresponding pad portions PAD of the second and third ground select gate electrodes GGE2 and GGE3.

The cell electrode structure CST may include the cell gate electrodes CGE and the intermediate dielectric layers ILDb that are vertically and alternately stacked on the lower planarized dielectric layer 120. As discussed with reference to FIG. 4, each of the cell gate electrodes CGE may include the electrode portions EP on the cell array region CAR that correspond to the first to fourth ground select gate electrodes GGE1 to GGE4. As discussed above, each of the cell gate electrodes CGE may also include the connection portion ECP, the line portions LP, and pad portions PAD.

The upper electrode structure UST may include the lower and upper string select gate electrodes SGEa and SGEb and the erase gate electrode EGE that are sequentially stacked on the cell electrode structure CST. A pair of lower (or upper) string select gate electrodes SGEa (or SGEb), each of which is separated from each other by the upper separation pattern USP, may correspond to the first to fourth ground select gate electrodes GGE1 to GGE4.

Referring to FIGS. 12 and 13A, when viewed in a plan view, the pad portions PAD of the first to fourth ground select gate electrodes GGE1 to GGE4 may be disposed closer to the cell array region CAR than the pad portions PAD of the cell gate electrodes CGE. In exemplary embodiments of the present inventive concept, the pad portions PAD of the second and fourth ground select gate electrodes GGE2 and GGE4 may be disposed closer to the cell array region CAR than the pad portions PAD of the first and fourth ground select gate electrodes GGE1 and GGE4. When viewed in a plan view, the pad portions PAD of the first and GGE4 may be positioned between the pad portions PAD of the lower and upper string select gate electrodes SGEa and SGEb and the pad portions PAD of the cell gate electrodes CGE. The first contact plugs PLG1 may be coupled to corresponding pad portions PAD of the first to fourth ground select gate electrodes GGE1 to GGE4.

In exemplary embodiments of the present inventive concept, the ground select gate electrodes, the cell gate electrodes, and the string select gate electrodes are illustrated to have pad portions PAD on the connection region CNR that are thicker than the electrode portions EP on the cell array region CAR, but the present inventive concept is not limited thereto. In other exemplary embodiments of the present inventive concept, electrodes included in an electrode structure may be formed of a semiconductor material, and certain horizontal patterns made of the semiconductor material may have features of the electrodes included in the electrode structure discussed above. In other exemplary embodiments of the present inventive concept, bit lines penetrating the electrode structure may have features of the electrodes included in the electrode structure discussed above.

FIGS. 15A to 21A are plan views showing a method of fabricating a three-dimensional semiconductor memory device according to exemplary embodiments of the present inventive concept. FIGS. 15B, 16B, 17B, 18B, 19B, 20B, 21B, 22A, and 23A are cross-sectional views respectively taken along line I-I' of FIGS. 15A, 16A, 17A, 18A, 19A, 20A and 21A, showing a method of fabricating a three-dimensional semiconductor memory device according to exemplary embodiments of the present inventive concept. FIGS. 20C, 21C, 22B, and 23B are cross-sectional views taken along line II-II' of FIGS. 20A and 21A.

Figure 15B:
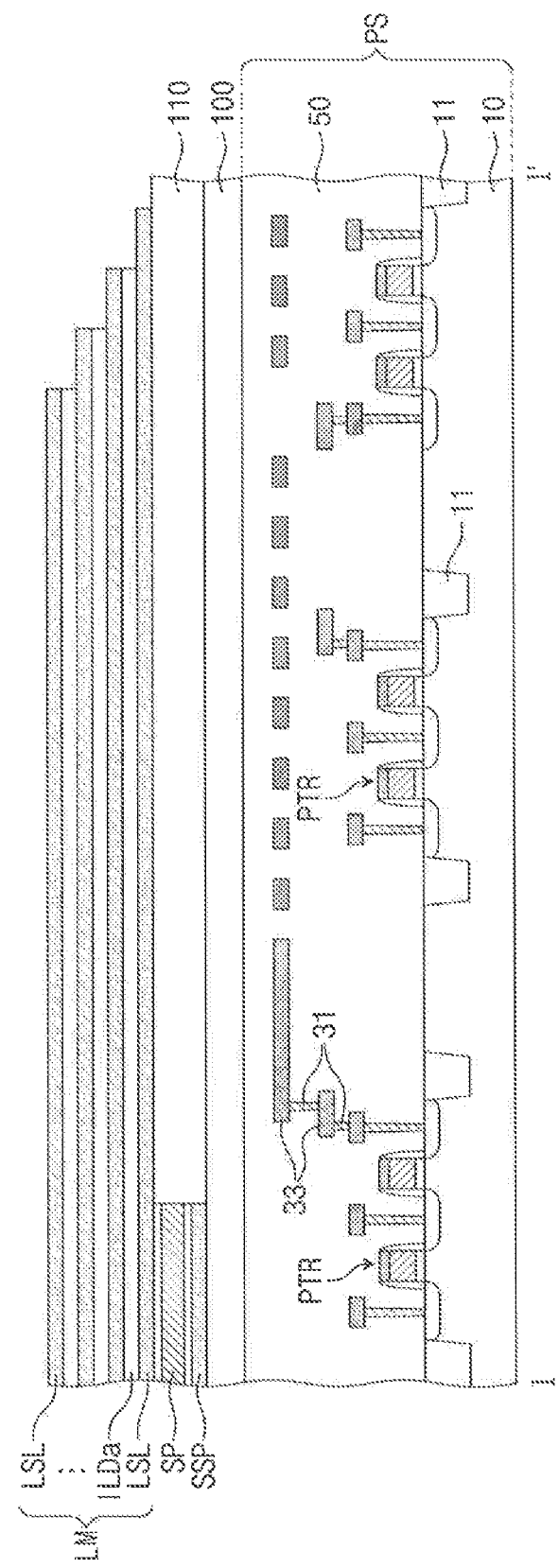

Referring to FIGS. 15A and 15B, a peripheral logic structure PS may be formed on a semiconductor substrate 10. The semiconductor substrate 10 may be a silicon wafer. The formation of the peripheral logic structure PS may include forming peripheral logic circuits PTR on the semiconductor substrate 10, forming peripheral line structures 31 and 33 connected to the peripheral logic circuits PTR, and forming a lower buried dielectric layer 50.

Row and column decoders, page buffers, and control circuits may be formed as the peripheral logic circuits PTR on the semiconductor substrate 10. The formation of the peripheral logic circuits PTR may include forming in the semiconductor substrate 10 a device isolation layer 11 for defining active regions, and forming NMOS and PMOS transistors on the semiconductor substrate 10. The formation of the peripheral line structures 31 and 33 may include forming peripheral contact plugs 31 partially penetrating the lower buried dielectric layer 50, and forming peripheral circuit lines 33 connected to the peripheral contact plugs 31. The lower buried dielectric layer 50 may include a single dielectric layer or a plurality of stacked dielectric layers.

After the formation of the peripheral circuit structure PS, a horizontal layer 100 may be formed to cover the peripheral circuit structure PS. The horizontal layer 100 may be formed on the lower buried dielectric layer 50. The horizontal layer 100 may be formed of a semiconductor material, and may have a single crystalline structure or a polycrystalline structure.

A support structure may be formed on the horizontal layer 100 of a cell array region CAR. The support structure may include a support sacrificial pattern SSP and a support conductive pattern SP that are stacked on the horizontal layer 100 of the cell array region CAR. The support structure may also include a buried dielectric layer 110 on the horizontal layer 100 of a connection region CNR. The buried dielectric layer 110 may cover a sidewall of the support sacrificial pattern SSP and a sidewall of the support conductive pattern SP.

A lower mold structure LM may be formed on the support structure. The formation of the lower mold structure LM may include forming a lower thin-layer structure by vertically and alternately stacking lower dielectric layers ILDa and lower sacrificial layers LSL, and forming a stepwise structure by repeatedly performing a patterning process on the lower thin-layer structure. The lower sacrificial layers LSL may be formed of a material having an etch selectivity with respect to the lower dielectric layers ILDa. The lower sacrificial layers LSL may include, for example, the same material as the support sacrificial pattern SSP.

Figure 16B:
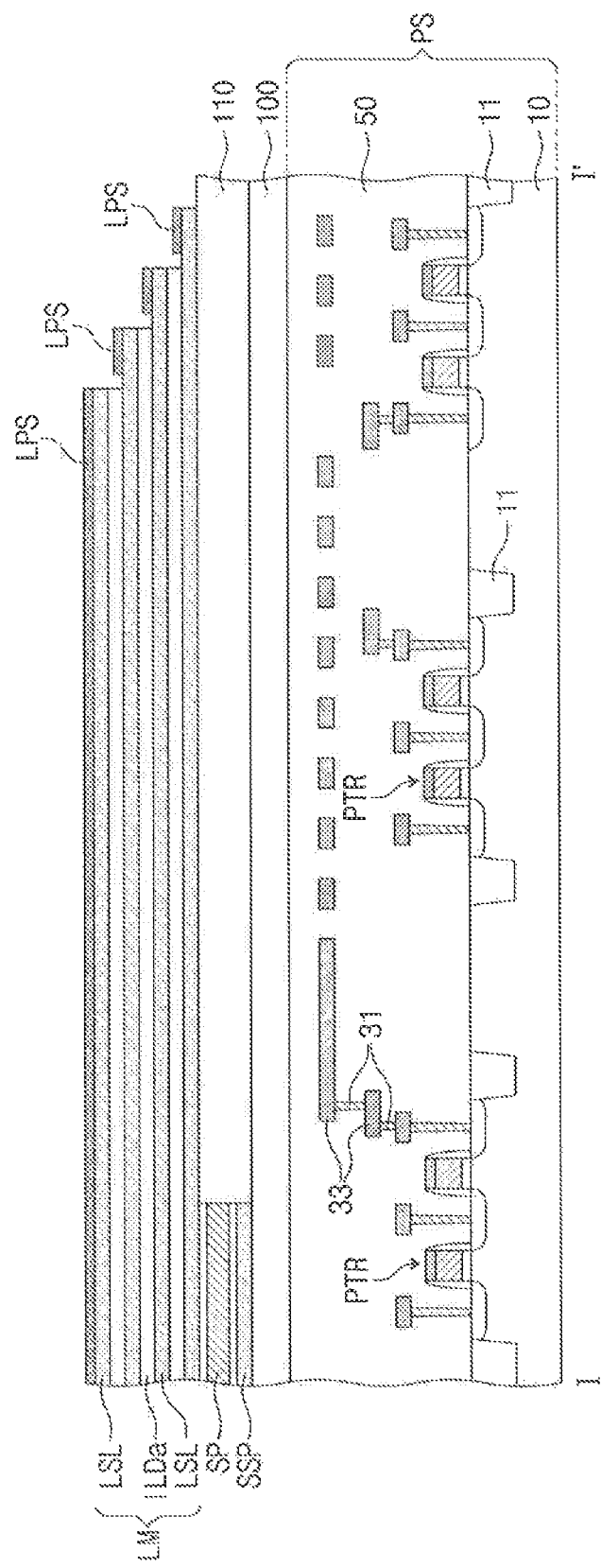

Referring to FIGS. 16A and 16B, lower pad sacrificial patterns LPS may be formed on corresponding top surfaces of the lower sacrificial layers LSL, and may be spaced apart from sidewalls of the lower dielectric layers ILDa.

The formation of the lower pad sacrificial patterns LPS may include conformally depositing a pad sacrificial layer on the lower thin-layer structure having the stepwise structure, and removing the pad sacrificial layer from the sidewalls of the lower dielectric layers ILDa. The lower pad sacrificial patterns LPS may include a material, which is the same as that of the lower sacrificial layers LSL and whose etch rate is greater than that of the lower sacrificial layers LSL. The lower pad sacrificial patterns LPS may be formed by depositing a layer whose material is the same as that of the lower sacrificial layers LSL, and then, performing an ion implantation process or a plasma treatment process to achieve a difference in etch rate between the lower pad sacrificial pattern LPS and the lower sacrificial layer LSL. As another example, when a deposition rate and process gases are controlled in a deposition process, the lower pad sacrificial patterns LPS may have a different etch rate from that of the lower sacrificial layers LSL.

In other exemplary embodiments of the present inventive concept, an uppermost one of the lower sacrificial layers LSL may be formed of a material whose etch rate is greater than that of other lower sacrificial layers LSL. In other exemplary embodiments of the present inventive concept, an uppermost one of the lower sacrificial layers LSL may be formed of a material whose etch rate is greater than that of other lower sacrificial layers LSL, and may be formed thicker than other sacrificial layers LSL.

Figure 17B:
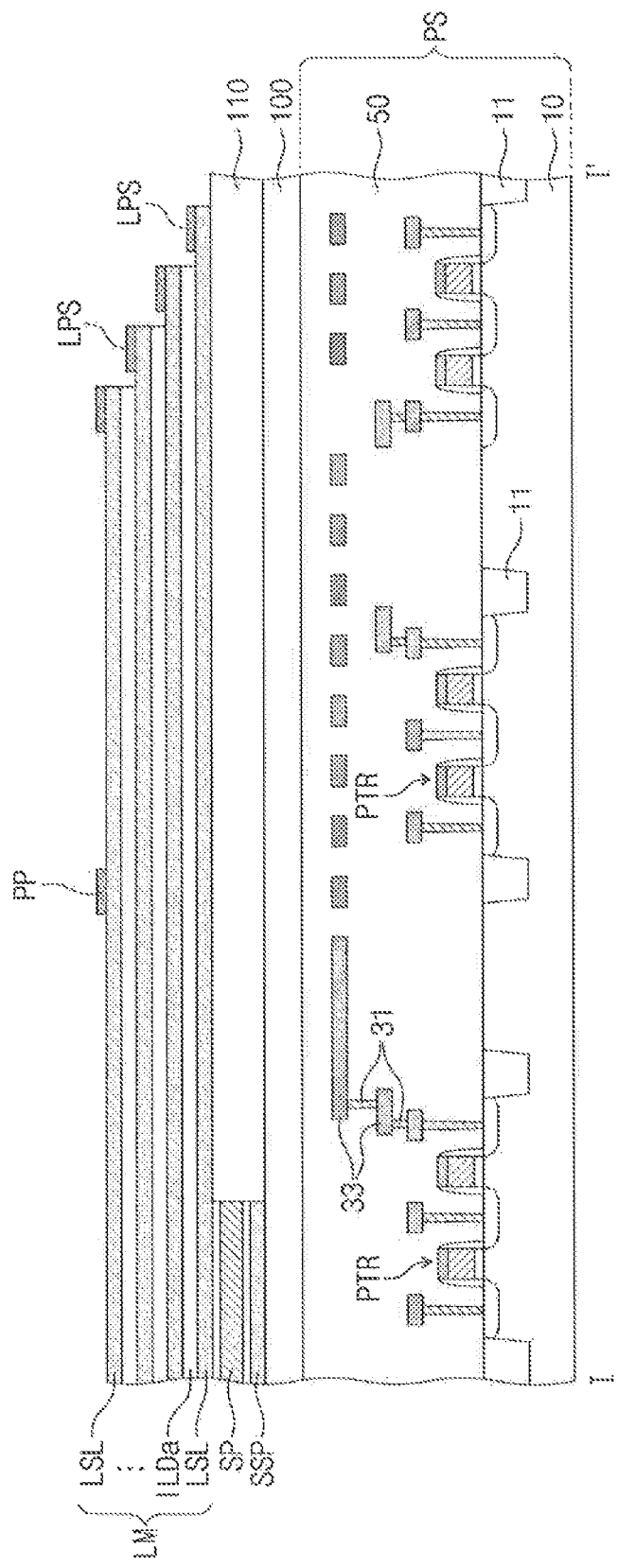

Referring to FIGS. 17A and 17B, the lower pad sacrificial pattern LPS formed on the uppermost lower sacrificial layer LSL may be patterned to form a pad mold pattern PP. The pad mold pattern PP may be horizontally spaced apart from the lower pad sacrificial patterns LPS, and may be disposed near the cell array region CAR. For example, the pad mold pattern PP may be closer to the cell array region CAR than the lower pad sacrificial patterns LPS.

Figure 18B:
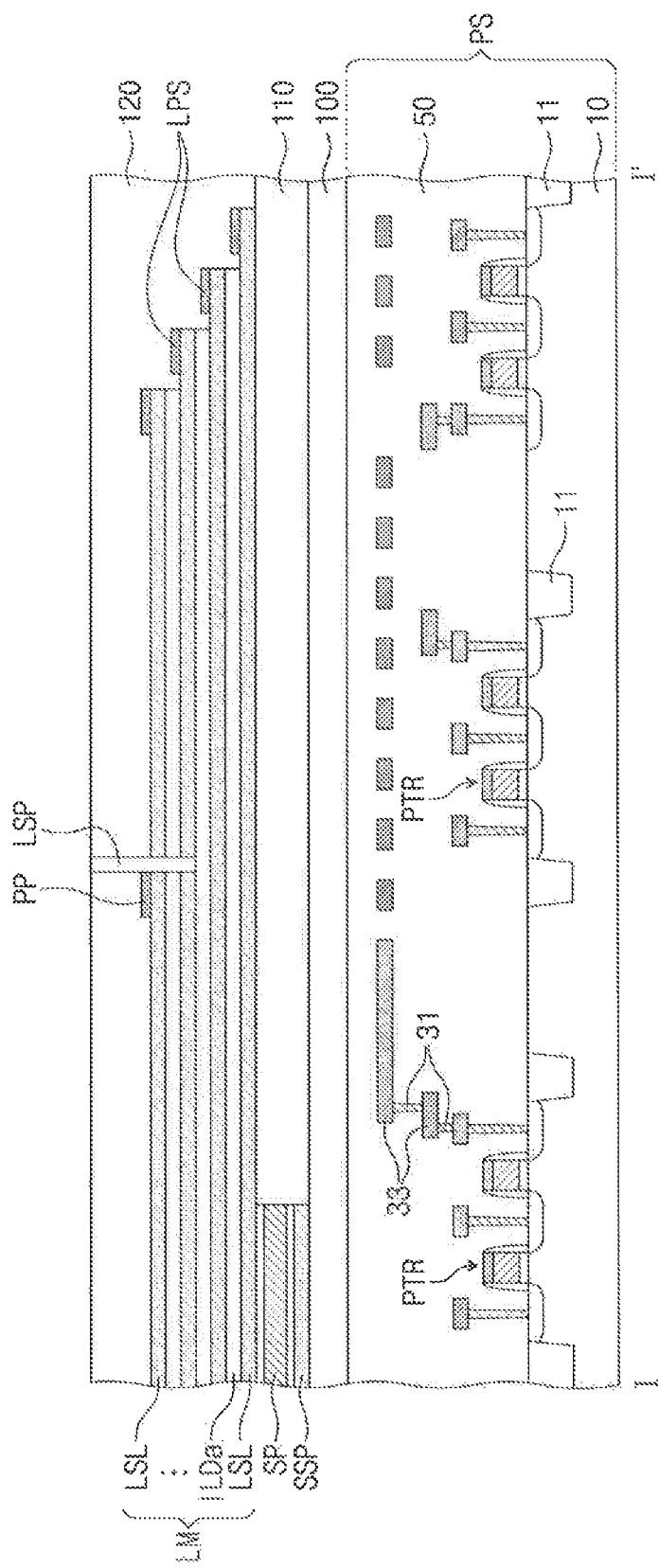

Referring to FIGS. 18A and 18B, a lower planarized dielectric layer 120 may be formed to cover the lower mold structure LM. A lower separation pattern LSP may be formed to penetrate the lower planarized dielectric layer 120 and at least the uppermost lower sacrificial layer LSL.

The lower separation pattern LSP may include a first part that extends in a second direction D2 and a second part that protrudes in a first direction D1 from the first part toward the cell array region CAR. The first part of the lower separation pattern LSP may contact a sidewall of the pad mold pattern PP, and the second part of the lower separation pattern LSP may divide the pad mold pattern PP into pieces in the second direction D2. In other words, the lower separation pattern LSP may intersect the pad mold pattern PP.

The lower separation pattern LSP may penetrate third and fourth lower sacrificial layers among first to fourth lower sacrificial layers LSL that are sequentially stacked, but the present inventive concept is not limited thereto. For another example, as shown in FIG. 10, the fourth lower sacrificial layer may be formed after a first lower separation pattern LSP1 is formed to penetrate the third lower sacrificial layer, and then, a second lower separation pattern LSP2 may be formed to penetrate the fourth lower sacrificial layer. As another example, as shown in FIG. 11, after the first to fourth lower sacrificial layers LSL and the lower planarized dielectric layer 120 are sequentially formed, the first lower separation pattern LSP1 may be formed to penetrate the third and fourth lower sacrificial layers, and then, the second lower separation pattern LSP2 may be formed to penetrate the fourth lower sacrificial layer.

Figure 19A:
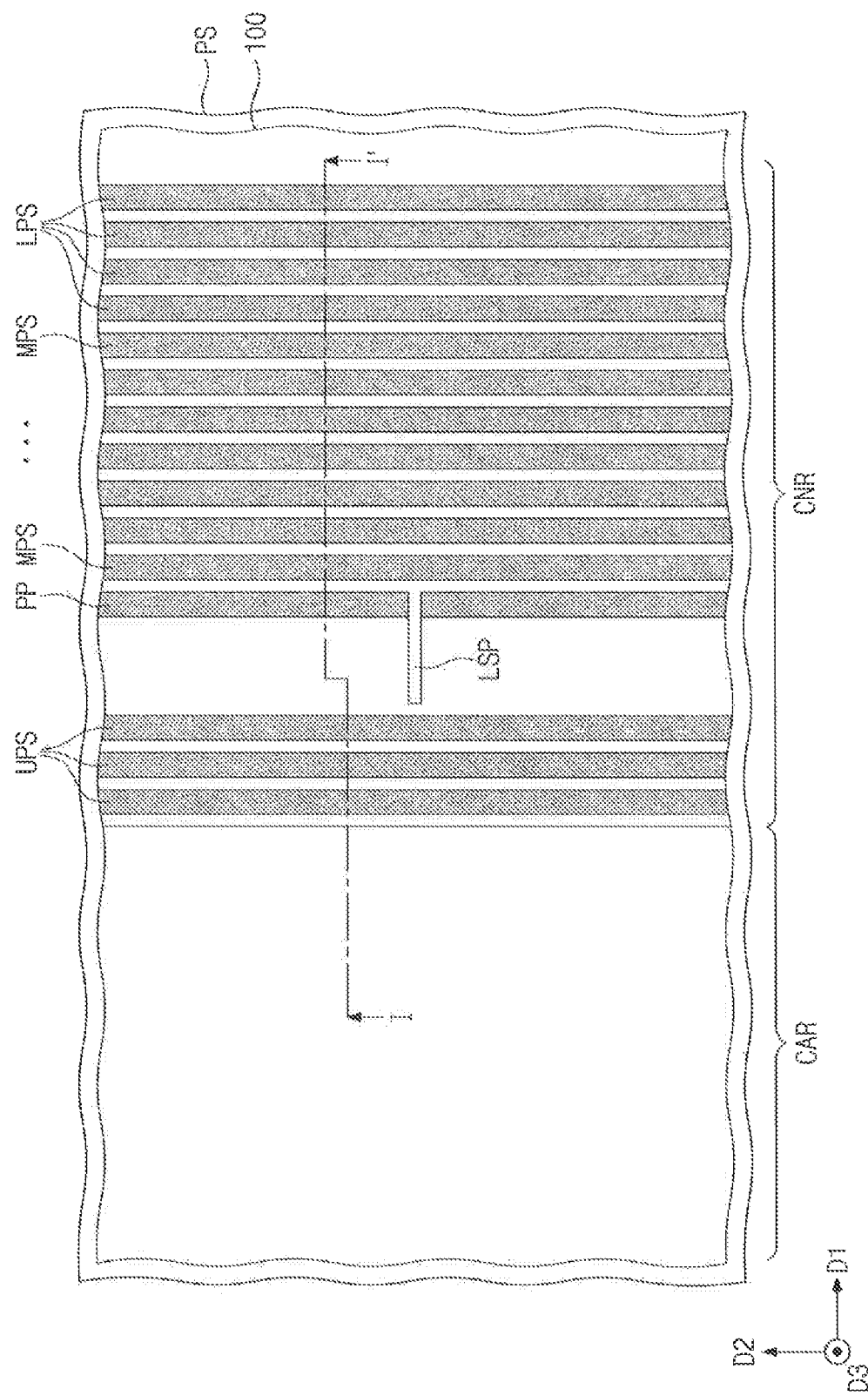

Referring to FIGS. 19A and 19B, an intermediate mold structure MM in which intermediate sacrificial layers MLS and intermediate dielectric layers ILDb are vertically and alternately stacked, may be disposed on the lower planarized dielectric layer 120. An upper mold structure UM in which upper sacrificial layers USL and upper dielectric layers ILDc are vertically and alternately stacked, may be disposed on the intermediate mold structure MM. The intermediate and upper sacrificial layers MSL and USL may be formed of the same material as that of the lower sacrificial layers LSL. For example, the intermediate and upper sacrificial layers MSL and USL may be formed of a silicon nitride layer, and the intermediate dielectric layers ILDb may be formed of a silicon oxide layer.

A patterning process may be performed on the intermediate and upper sacrificial layers MSL and USL and on the intermediate and upper dielectric layers ILDb and ILDc, and thus, each of the intermediate and upper mold structures MM and UM may have a downward stepwise structure on the connection region CNR.

When viewed in a plan view, the stepwise structure of the intermediate mold structure MM may cover the pad mold pattern PP of the lower mold structure LM. When viewed in a plan view, the pad mold pattern PP of the lower mold structure LM may be disposed between the stepwise structure of the intermediate mold structure MM and the stepwise structure of the upper mold structure UM.

Intermediate and upper pad sacrificial patterns MPS and UPS may be formed on corresponding top surfaces of the intermediate and upper sacrificial layers MSL and USL, and may be spaced apart from sidewalls of the intermediate and upper dielectric layers ILDb and ILDc. The intermediate and upper pad sacrificial patterns MPS and UPS may be formed by the same method of forming the lower pad sacrificial patterns LPS discussed above with reference to FIGS. 16A and 16B. Therefore, the intermediate and upper pad sacrificial patterns MPS and UPS may be etched relatively faster than the intermediate sacrificial layers MSL. When viewed in a plan view, the intermediate pad sacrificial patterns MPS may be disposed between the pad mold pattern PP and the lower pad sacrificial patterns LPS. After the formation of the intermediate and upper pad sacrificial patterns MPS and UPS, an upper planarized dielectric layer 130 may be formed.

Figure 20A:
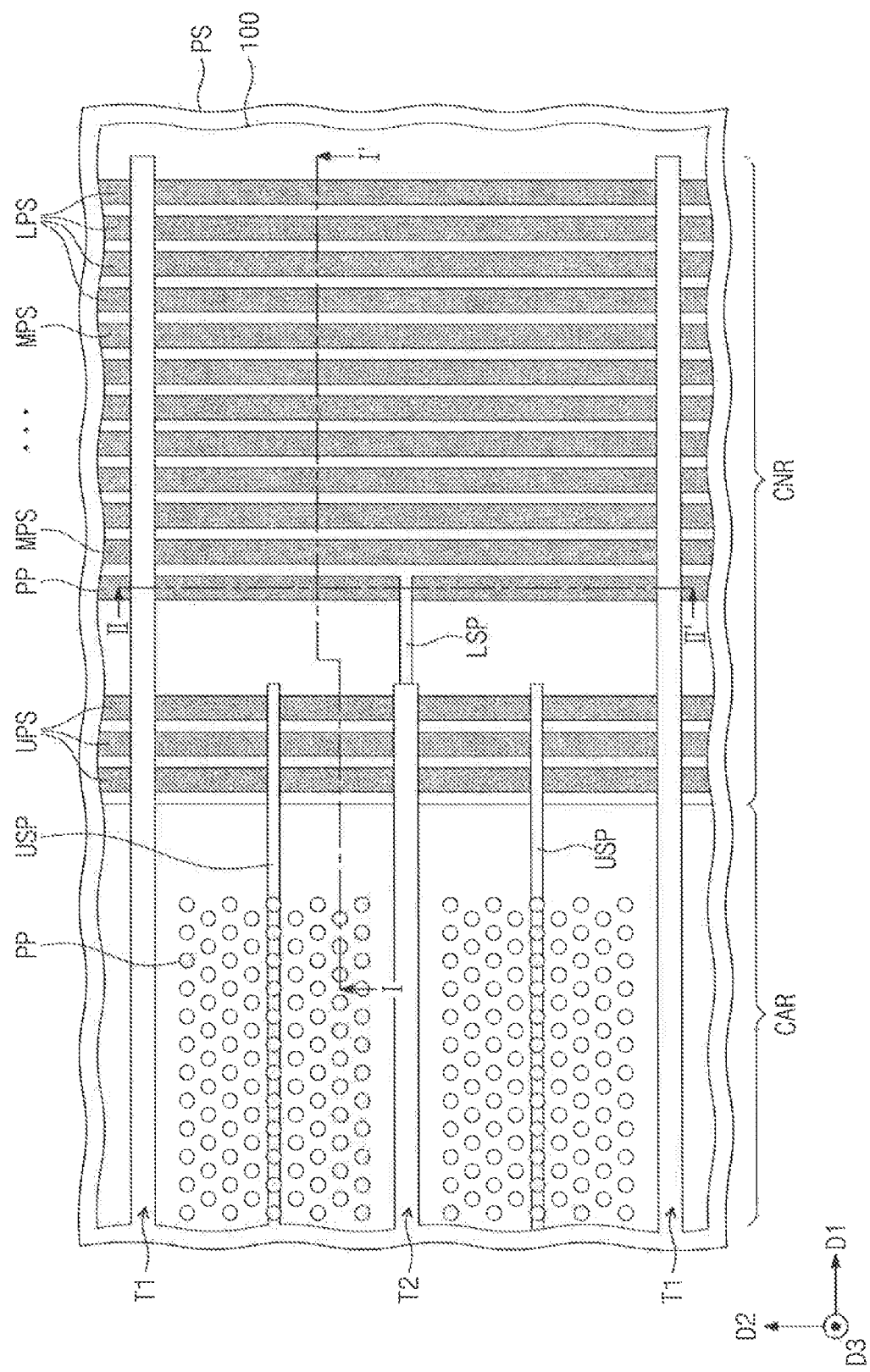
Figure 20B:
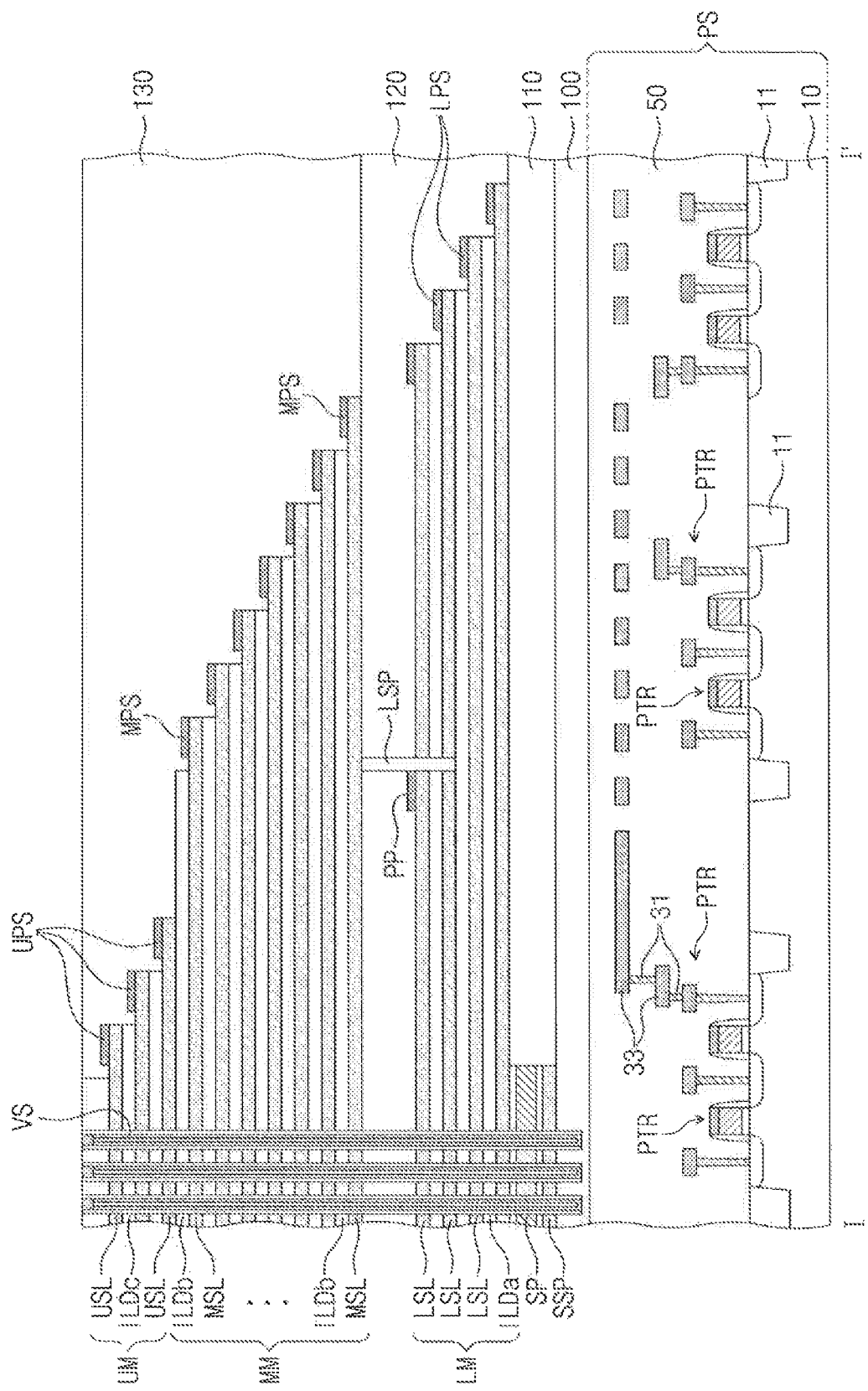
Figure 20C:
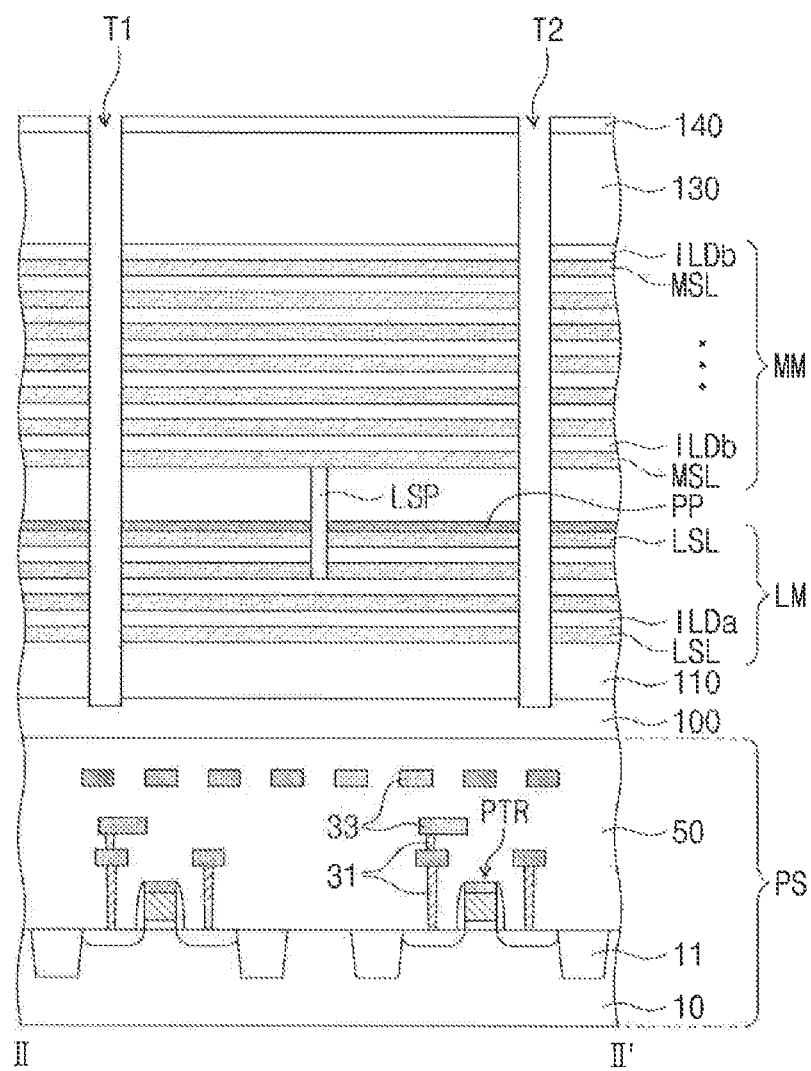

Referring to FIGS. 20A, 20B, and 20C, an upper separation pattern USP may be formed to extend in the first direction D1 and to penetrate the upper mold structure UM.

The upper separation pattern USP may divide the upper mold structure UM into line patterns. Afterwards, on the cell array region CAR, vertical semiconductor patterns VS may be formed to penetrate the upper, intermediate, and lower mold structures UM, MM, and LM and the support structure. The formation of the vertical semiconductor patterns VS may include forming vertical holes that penetrate the upper, intermediate, and lower mold structures UM, MM, and LM and the support structure and that expose the horizontal layer 100, and sequentially depositing a date storage layer and a vertical semiconductor layer in each of the vertical holes.

After the formation of the vertical semiconductor patterns VS, a first interlayer dielectric layer 140 may be formed to lie on the upper planarized dielectric layer 130 and to cover top surfaces of the vertical semiconductor patterns VS. Thereafter, first and second separation trenches T1 and T2 may be formed.

The first and second separation trenches T1 and T2 may penetrate the upper, intermediate, and lower mold structures UM, MM, and LM and the support structure, while exposing the horizontal layer 100. The first and second separation trenches T1 and T2 may extend along the first direction D1 from the cell array region CAR to the connection region CNR. The second separation trench T2 may have a length in the first direction D1 less than that of the first separation trench T1. The second separation trench T2 may be connected in the first direction D1 to the second part of the lower separation pattern LSP.

Figure 21A:
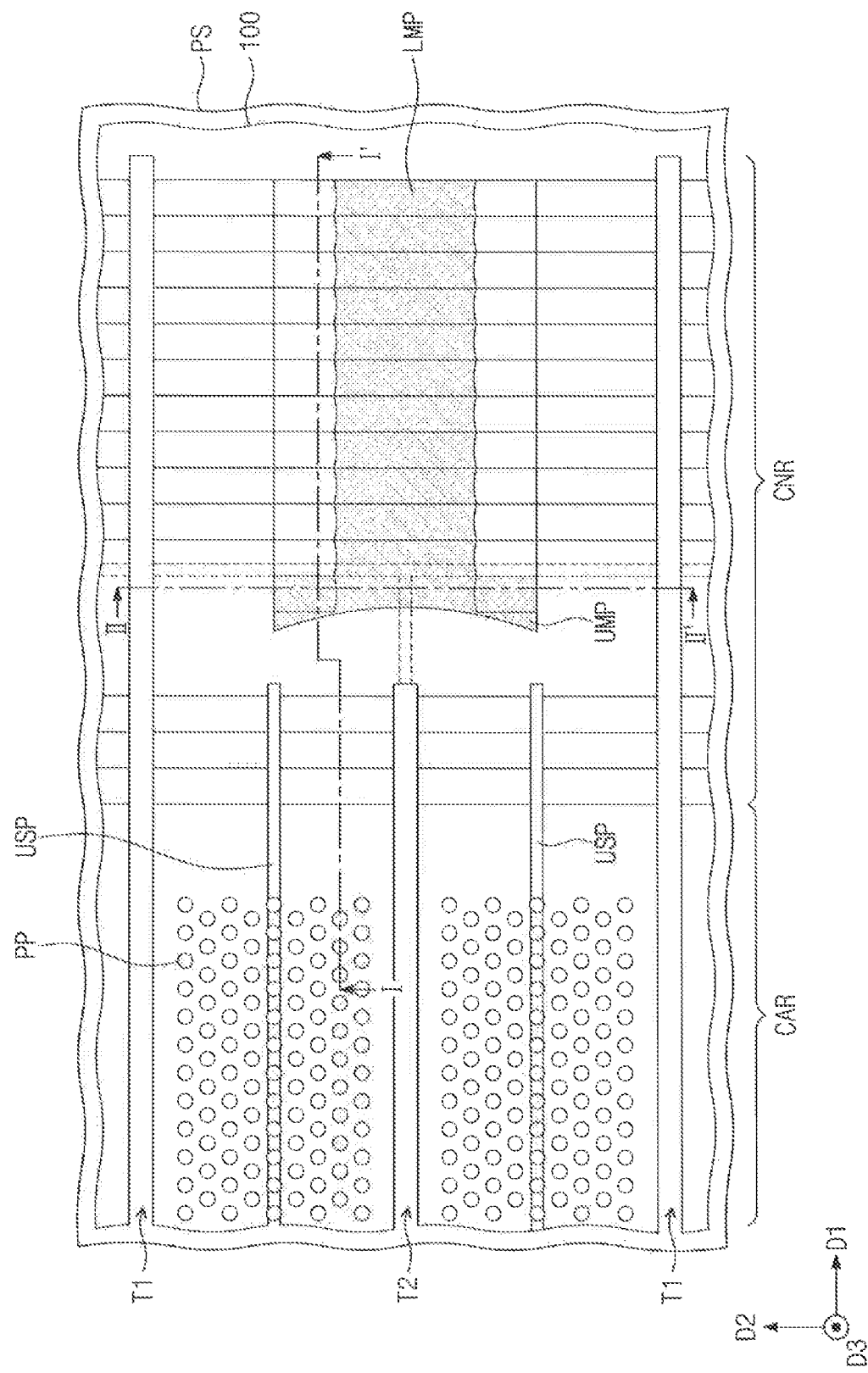
Figure 21B:
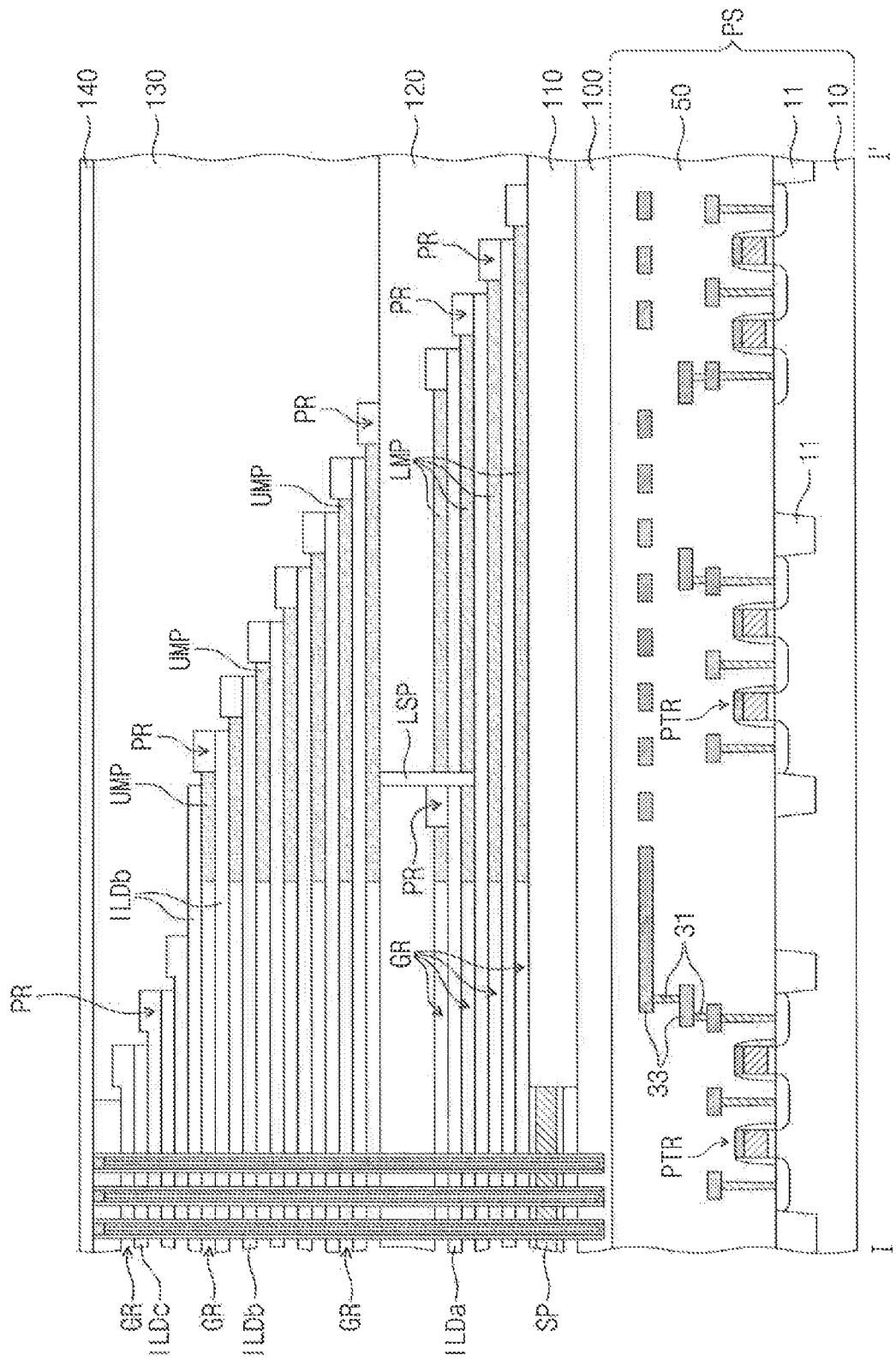
Figure 21C:
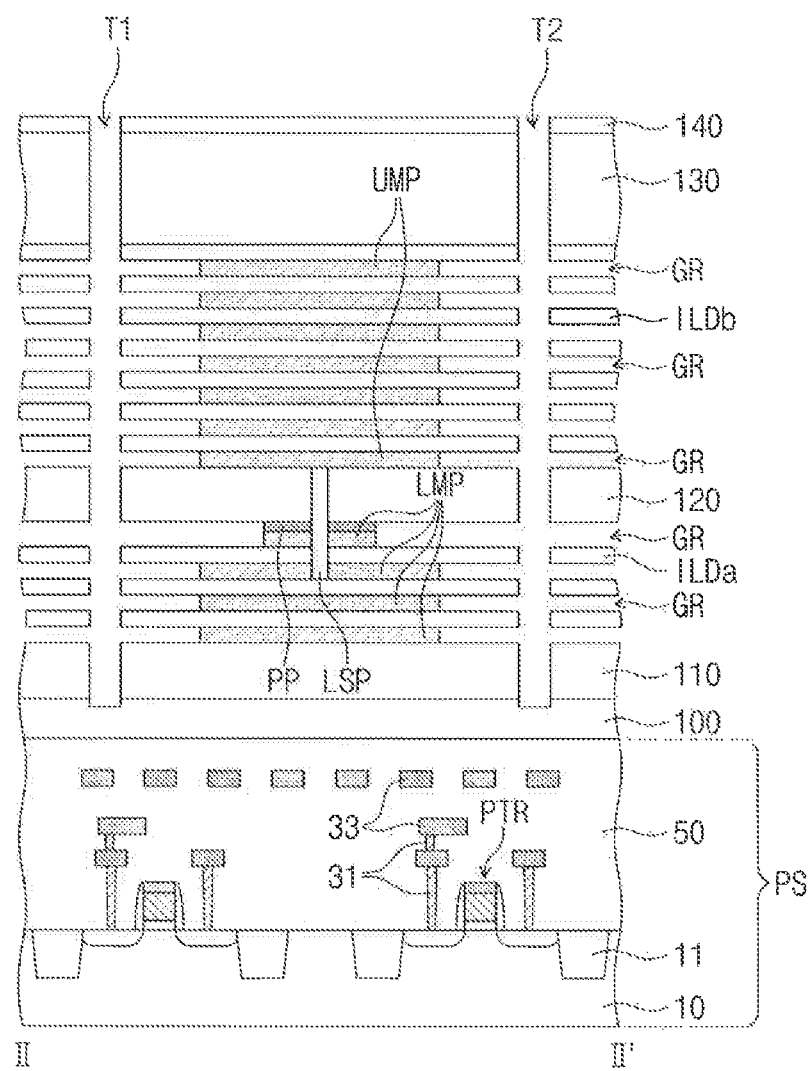

Referring to FIGS. 21A, 21B, and 21C, gate regions GR may be formed by removing the lower, intermediate, and upper sacrificial layers LSL, MSL, and USL exposed by the first and second separation trenches T1 and T2. The formation of the gate regions GR may include performing on the lower, intermediate, and upper sacrificial layers LSL, MSL, and USL an isotropic etching process whose etch recipe has an etch selectivity of the lower, intermediate, and upper sacrificial layers LSL, MSL, and USL with respect to the lower, intermediate, and upper dielectric layers ILDa, ILDb and ILDc, the vertical semiconductor patterns VS, and the horizontal layer 100. The isotropic etching process may completely remove the lower, intermediate, and upper sacrificial layers LSL, MSL, and USL. The lower and intermediate sacrificial layers LSL and MSL and the pad mold pattern PP may partially remain to form lower and upper mold patterns LMP and UMP.

When the isotropic etching process is performed to form the gate regions GR, because the lower, intermediate, and upper pad sacrificial patterns LPS, MPS, and UPS are etched at high rates on the stepwise structures of the lower, intermediate, and upper mold structures LM, MM, and UM, the gate regions GR may expand in the second direction D2. Therefore, the gate regions GR may include corresponding pad regions PR on the connection region CNR.

Figure 22A:
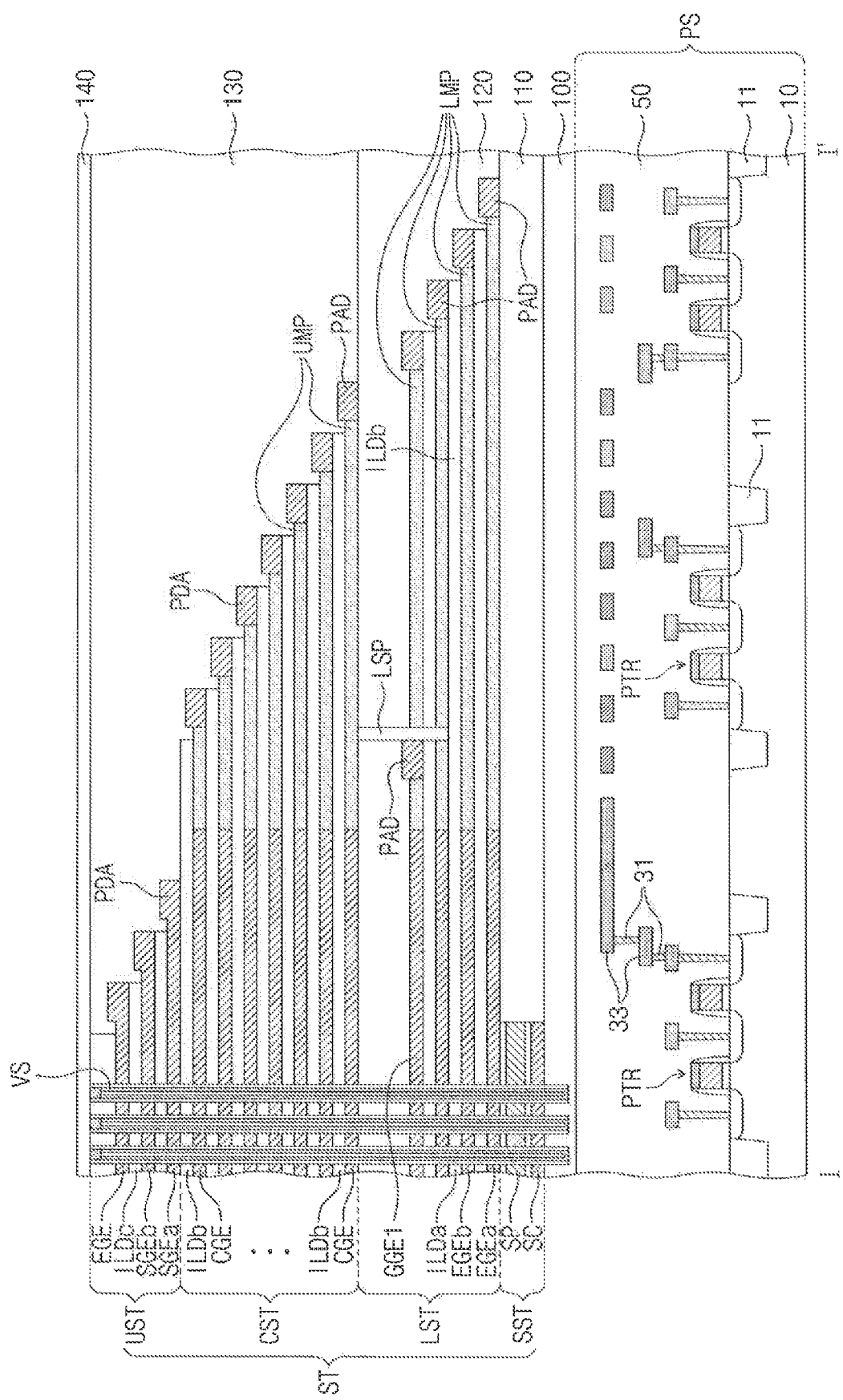
Figure 22B:
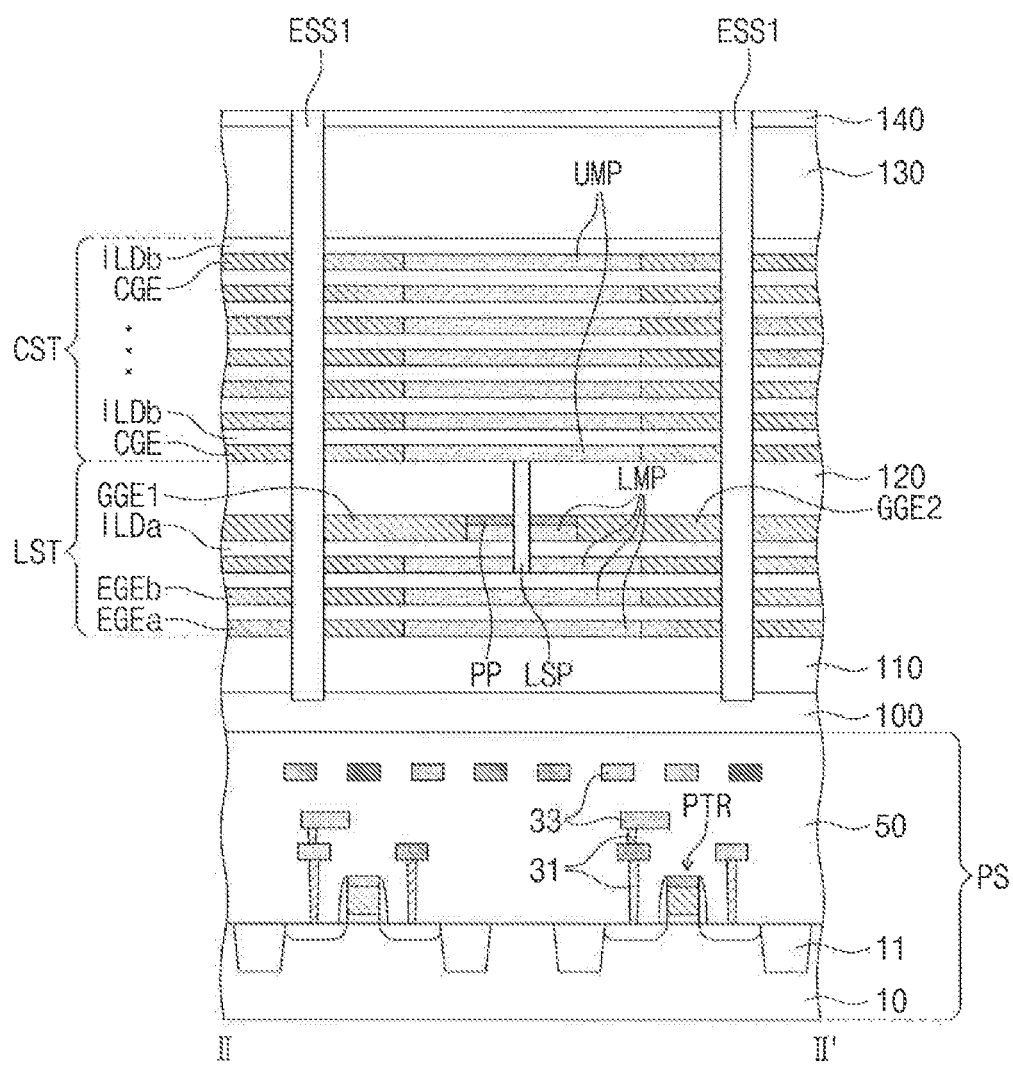

Referring to FIGS. 22A and 22B, horizontal dielectric patterns and electrodes GGE (e.g., GGE1 and GGE2), CGE, and SGE (e.g., SGEa and SGEb) may be formed in the gate regions GR, and thus, an electrode structure ST may be formed on the horizontal layer 100. The horizontal dielectric pattern may include one or more of a silicon oxide layer and a high-k dielectric layer, serving as a portion of a data storage layer of a NAND Flash memory device. After the formation of the electrodes GGE, CGE, and SGE, a dielectric material may fill the first and second separation trenches T1 and T2, and conductive plugs may be formed in the first and second separation trenches T1 and T2.

Figure 23A:
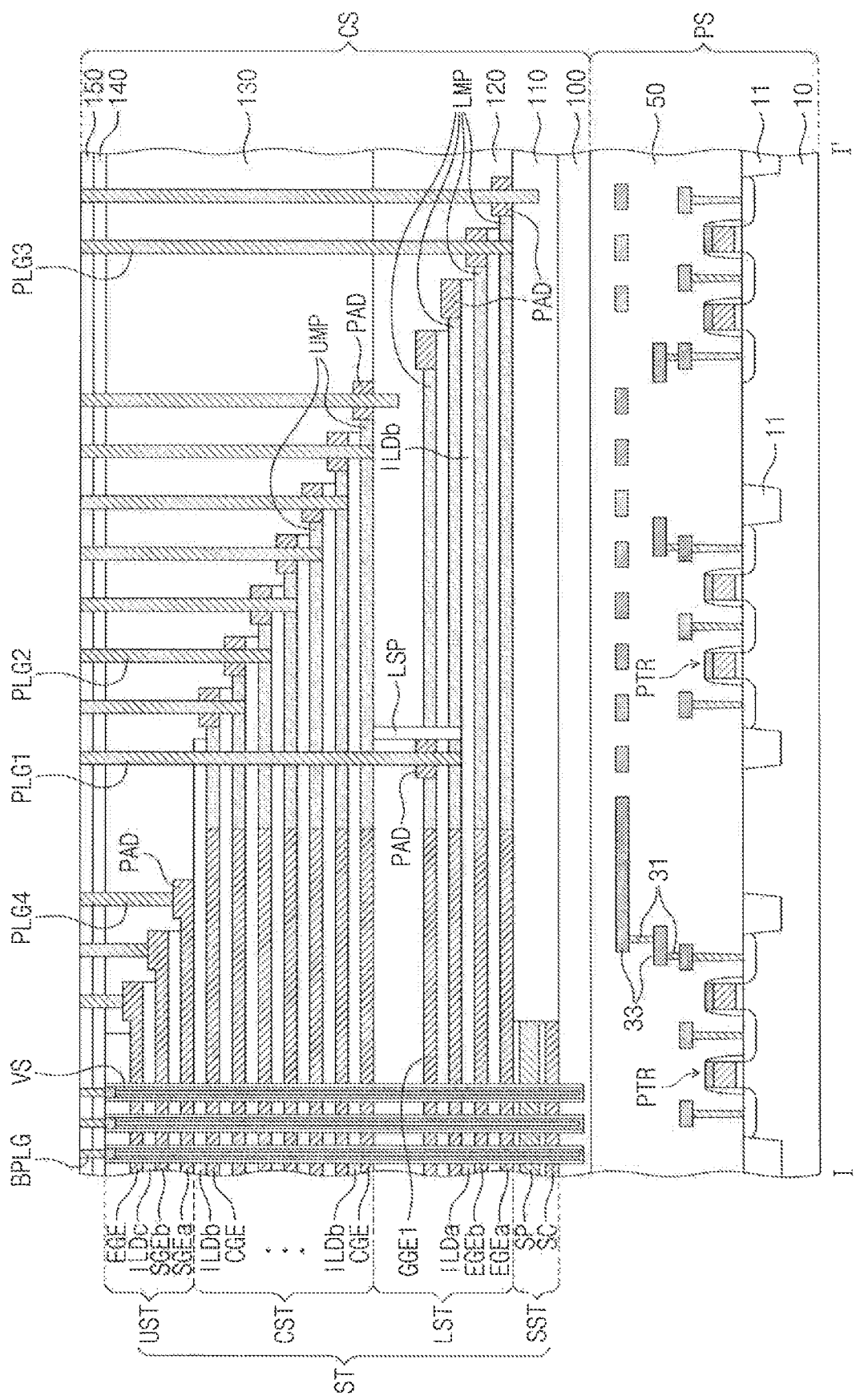
Figure 23B:
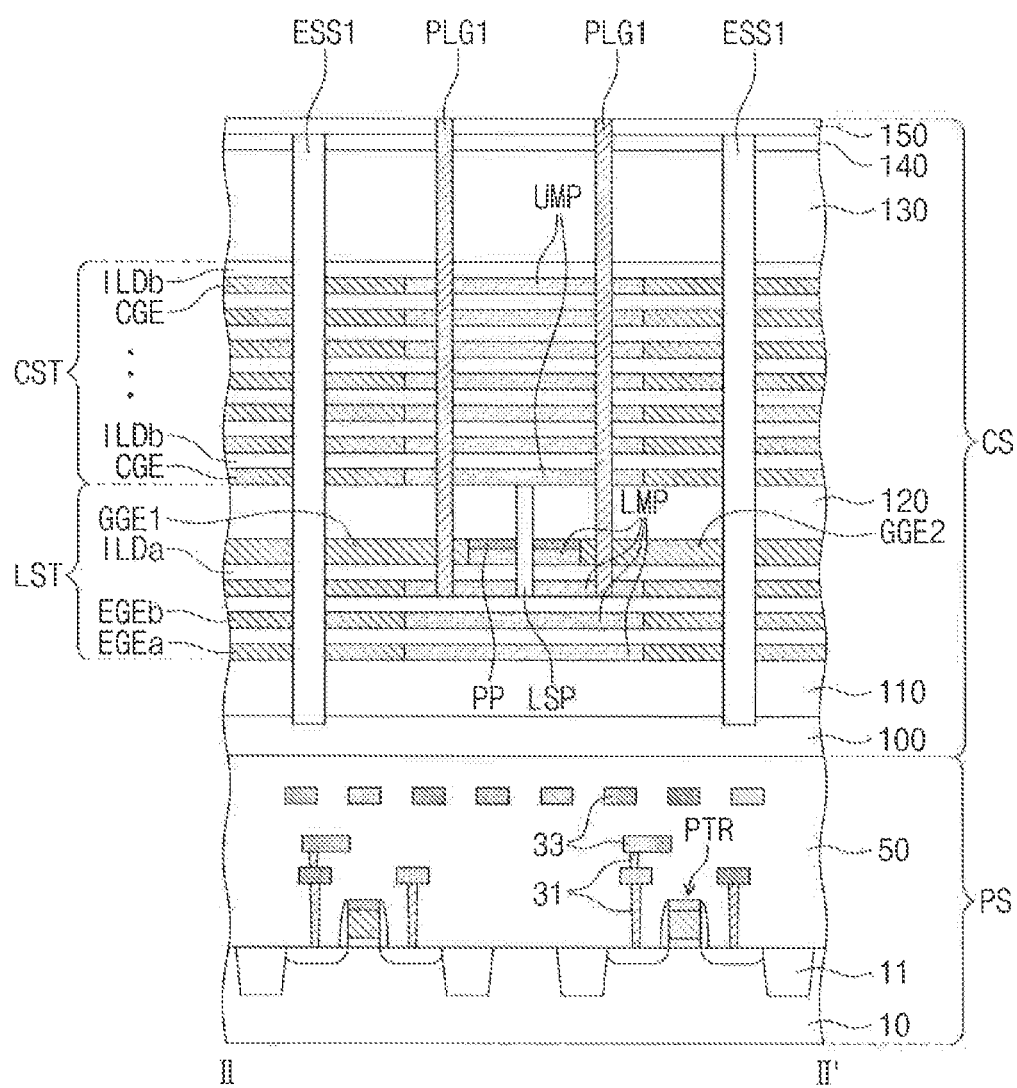

Referring to FIGS. 23A and 23B, first and second interlayer dielectric layers 140 and 150 may be formed. After that, bit line contact plugs BPLG may be formed on the cell array region CAR, and first to fourth contact plugs PEG1 to PLG4 may be formed on the connection region CNR. The bit line contact plugs BPLG and the first to fourth contact plugs PLG1 to PLG4 may include one or more of a metal and a metal nitride.

When the first to fourth contact plugs PLG1 to PLG4 are formed, the lower and upper mold patterns LMP and UMP below a pad portion PAD of each electrode may be used as etch stop layers. Alternatively, the first to fourth contact plugs PLG1 to PLG4 may successively penetrate the lower and upper mold patterns LMP and UMP below the pad portion PAD, and may be coupled to the peripheral circuit lines 33 of the peripheral logic structure PS.

According to exemplary embodiments of the present inventive concept, ground select gate electrodes between a cell electrode structure and a horizontal layer may be electrically and physically separated from each other. A through line structure may penetrate a portion of the cell electrode structure, and may be adjacent in a first direction to pad portions of the ground select gate electrodes. The pad portions of the ground select gate electrodes may be coupled to contact plugs and may be closer to a cell array region than pad portions of cell gate electrodes. Thus, when the through line structure is formed, the ground select gate electrodes may not be divided in the first direction and may be supplied with voltages through the contact plugs.

Furthermore, on first and second connection regions on opposite sides of the cell array region, the contact plugs may be coupled to the electrodes, and accordingly, it is possible to increase the freedom of design of connection lines coupled to the electrode structure. In addition, because opposite ends of each electrode may be supplied with operating voltages, it is possible to increase transfer speeds of signals applied to the electrodes.

While the present inventive concept has been particularly shown and described with reference to exemplary embodiments thereof, it will be understood by those skilled in the art that various changes and modifications may be made thereto without departing from the spirit and scope of the inventive concept set forth in the attached claims.

What is claimed is:

1. A three-dimensional semiconductor memory device, comprising;
 a substrate including a cell array region and a connection region; and
 an electrode structure extending along a first direction from the cell array region to the connection region and including a plurality of electrodes vertically stacked on the substrate, each of the electrodes including an electrode portion on the cell array region and a pad portion on the connection region,
 wherein the electrodes include:
  an erase gate electrode located at a first level from the substrate;
  a ground select gate electrode located at a second level from the substrate, the second level being higher than the first level; and
  a cell gate electrode located at a third level from the substrate, the third level being higher than the second level, and
 wherein the pad portion of the ground select gate electrode is closer to the cell array region in the first direction than the pad portion of the cell gate electrode and the pad portion of the erase gate electrode.

2. The device of claim 1, wherein the electrode structure further includes a plurality of mold patterns, and wherein each of the mold patterns is located at the same level as a corresponding one of the electrodes.

3. The device of claim 2, further comprising:
a first contact plug coupled to the pad portion of the erase gate electrode;
a second contact plug coupled to the pad portion of the ground select gate electrode;
a third contact plug coupled to the pad portion of the cell gate electrode; and
a through plug spaced apart from the first, second, and third contact plugs, the through plug penetrating the mold patterns.

4. The device of claim 2, wherein the pad portion of the ground select gate electrode overlaps the mold patterns.

5. The device of claim 1, wherein the pad portion of each of the electrodes includes:
a line section that extends in the first direction; and
a protrusion section that protrudes from the line section in a second direction intersecting the first direction.

6. The device of claim 5, wherein a thickness of the protrusion section is greater than a thickness of the line section.

7. The device of claim 1, further comprising:
a source conductive pattern between the substrate and an electrode structure, the source conductive pattern extending in parallel to a top surface of the substrate; and
a vertical semiconductor pattern penetrating the electrode structure and the so conductive pattern.
wherein the source conductive pattern is in contact with a portion of a sidewall of the vertical semiconductor pattern.

8. The device of claim 7, wherein the source conductive pattern comprises:
a horizontal portion extending in parallel to the electrode structure under the electrode structure; and
a sidewall portion extending from the horizontal portion in the vertical direction and surrounding the portion of the sidewall of the vertical semiconductor pattern.

9. The device of claim 8, further comprising:
a data storage pattern disposed between the vertical semiconductor pattern and the electrode structure,
wherein a bottom surface of the data storage pattern is in contact with the sidewall portion of the source conductive pattern.

10. The device of claim 1, further comprising a peripheral circuit structure,
wherein the substrate is disposed between the electrode structure and the peripheral circuit structure.

11. The device of claim 1, further comprising:
a peripheral circuit structure below the substrate;
a first contact plug connecting the pad portion of the erase gate electrode to the peripheral circuit structure;
a second contact plug connecting the pad portion of the ground select gate electrode to the peripheral circuit structure; and
a third contact plug connecting the pad portion of the cell gate electrode to the peripheral circuit structure.

12. The device of claim 11, wherein the electrode structure further includes a plurality of mold patterns,
wherein each of the mold patterns is located at the same level as a corresponding one of the electrodes, and
wherein the first, second, and third contact plugs penetrate the mold patterns.

13. A three-dimensional semiconductor memory device, comprising:

a substrate including a cell array region and a connection region;
an electrode structure extending along a first direction from the cell array region to the connection region and including a plurality of electrodes vertically stacked on the substrate, each of the electrodes including an electrode portion on the cell array region, a line portion that extends in the first direction on the connection region, and a pad portion that protrudes from the line portion in a second direction intersecting the first direction; and
a plurality of contact plugs correspondingly coupled to the pad portions of the electrodes;
wherein the electrodes include an erase gate electrode, a ground select gate electrode, a plurality of cell gate electrodes, and a string select gate electrode, which are vertically and sequentially stacked on the substrate with insulating layers interposed therebetween, and
wherein, in the first direction, the pad portion of the ground select gate electrode is between the pad portion of the string select gate electrode and the pad portions of the cell gate electrodes.

14. The device of claim 13, wherein the electrode structure further includes a plurality of mold patterns,
wherein each of the mold patterns is located at the same level as a corresponding one of the electrodes, and
wherein the pad portion of the ground select gate electrode is between vertically adjacent ones of the mold patterns.

15. The device of claim 14, wherein the contact plugs include a first contact plug coupled to the pad portion of the ground select gate electrode, and
wherein the first contact plug penetrates the mold patterns.

16. The device of claim 13, wherein a thickness of the pad portion is greater than a thickness of the line portion.

17. A three-dimensional semiconductor memory device, comprising:
a peripheral logic structure;
a cell array structure disposed on the peripheral logic structure, the cell array structure including:
a substrate including a cell array region and a connection region;
a source conductive pattern on the substrate,
an erase gate electrode on the source conductive pattern, the erase gate electrode including a pad portion disposed in the connection region;
a plurality of cell gate electrodes disposed on the cell array region and having pad portions disposed in the connection region, the pad portions of the cell gate electrodes having a stepwise shape; and
a ground select gate electrode disposed between the cell gate electrodes and the erase gate electrode, the ground select gate electrode including a pad portion that is closer to the cell array region than the pads of the cell gate electrodes.

18. The device of claim 17, wherein each of the erase gate electrode, cell gate electrodes, and ground select gate electrode includes:
an electrode portion on the cell array region,
a line portion that extends in the first direction on the connection region, and
the pad portion that protrudes from the line portion in a second direction intersecting the first direction.

19. The device of claim 17, further comprising:
a first contact plug connecting the pad portion of the erase gate electrode to the peripheral circuit structure;

a second contact plug connecting the pad portion of the ground select gate electrode to the peripheral circuit structure; and a third contact plug connecting the pad portion of the cell gate electrode to the peripheral circuit structure.

20. The device of claim 17, further comprising a plurality of mold patterns, each of the mold patterns located at the same level as a corresponding one of the electrodes, wherein the pad portion of the ground select gate electrode is between vertically adjacent ones of the retold patterns.

\* \* \* \* \*